(12) United States Patent
Maluf et al.

(10) Patent No.: US 7,367,359 B2
(45) Date of Patent: *May 6, 2008

(54) PROPORTIONAL MICROMECHANICAL VALVE

(75) Inventors: Nadim I. Maluf, Los Altos, CA (US); Kirt R. Williams, Portola Valley, CA (US); Bert P. Van Drieenhuizen, Fremont, CA (US); Edward Nelson Fuller, Manchester, MI (US); Richard J. Barron, Ann Arbor, MI (US)

(73) Assignees: Kelsey-Hayes Company, Livonia, MI (US); GE Novasensor, Inc., Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/075,057

(22) Filed: Mar. 7, 2005

(65) Prior Publication Data

US 2005/0156129 A1    Jul. 21, 2005

Related U.S. Application Data

(63) Continuation of application No. 10/024,957, filed on Dec. 18, 2001, which is a continuation-in-part of application No. 09/148,026, filed on Sep. 3, 1998, now abandoned.

(51) Int. Cl.
F15C 1/04 (2006.01)

(52) U.S. Cl. .................. 137/831; 137/833; 137/554; 251/11; 303/119.2

(58) Field of Classification Search ............. 303/119.2, 303/119.3; 251/129.06–129.08, 368, 11, 251/281–283, 231, 301, 87, 88; 60/527, 60/528; 310/306, 307, 310; 137/596.17, 137/596, 625.4, 625.42, 625.44, 625.45, 137/625.65, 505.18, 601.02, 831, 833, 554
See application file for complete search history.

(56) References Cited

U.S. PATENT DOCUMENTS 886,045 A    4/1908    Ehrlich et al.

(Continued)

FOREIGN PATENT DOCUMENTS

DE    2215526    10/1973

(Continued)

OTHER PUBLICATIONS

Author Unknown, (Sep./Oct. 1999). "Hi TecMetal Group Develops Niche Market for Brazed Laminated Assemblies," *Fluid Power Journal* p. 27.

(Continued)

*Primary Examiner*—Robert A. Siconolfi
*Assistant Examiner*—Vu Q. Nguyen
(74) *Attorney, Agent, or Firm*—Morrison & Foerster LLP

(57) ABSTRACT

The present invention provides a proportional microvalve having a first, second and third layer, and having high aspect ratio geometries. The first layer defines a cavity with inlet and outlet ports. The second layer, doped to have a low resistivity and bonded between the first and third layers, defines a cavity having a flow area to permit fluid flow between the inlet and outlet ports. The second layer further defines an actuatable displaceable member, and one or more thermal actuators for actuating the displaceable member to a position between and including an open and a closed position to permit or occlude fluid flow. The third layer provides one wall of the cavity and provides electrical contacts for electrically heating the thermally expandable actuators. The thermal actuators and the displaceable member have high aspect ratios and are formed by deep reactive ion etching such that they are displaceable in the plane of the second layer while being very stiff out of the plane. Thus, both actuation and displacement of the displaceable member are in the plane of the layer.

40 Claims, 14 Drawing Sheets

U.S. PATENT DOCUMENTS

| | | |
|---|---|---|
| 1,886,205 A | 11/1932 | Lyford |
| 1,926,031 A | 9/1933 | Boynton |
| 2,412,205 A | 12/1946 | Cook |
| 2,504,055 A | 4/1950 | Thomas |
| 2,840,107 A | 6/1958 | Campbell |
| 2,875,779 A | 3/1959 | Campbell |
| 3,031,747 A | 5/1962 | Green |
| 3,729,807 A | 5/1973 | Fujiwara |
| 3,747,628 A | 7/1973 | Holster et al. |
| 3,860,949 A | 1/1975 | Sloeckert et al. |
| 4,005,454 A | 1/1977 | Froloff et al. |
| 4,019,388 A | 4/1977 | Hall, II et al. |
| 4,023,725 A | 5/1977 | Ivett et al. |
| 4,152,540 A | 5/1979 | Duncan et al. |
| 4,181,249 A | 1/1980 | Peterson et al. |
| 4,298,023 A | 11/1981 | McGinnis |
| 4,341,816 A | 7/1982 | Lauterbach et al. |
| 4,434,813 A | 3/1984 | Mon |
| 4,581,624 A | 4/1986 | O'connor |
| 4,628,576 A | 12/1986 | Giachino et al. |
| 4,647,013 A | 3/1987 | Giachino et al. |
| 4,661,835 A | 4/1987 | Gademan et al. |
| 4,772,935 A | 9/1988 | Lawler et al. |
| 4,821,997 A | 4/1989 | Zdeblick |
| 4,824,073 A | 4/1989 | Zdeblick |
| 4,826,131 A | 5/1989 | Mikkor |
| 4,828,184 A | 5/1989 | Gardner et al. |
| 4,869,282 A | 9/1989 | Sittler et al. |
| 4,938,742 A | 7/1990 | Smits |
| 4,943,032 A | 7/1990 | Zdeblick |
| 4,959,581 A | 9/1990 | Dantlgraber |
| 4,966,646 A | 10/1990 | Zdeblick |
| 5,029,805 A | 7/1991 | Albarda et al. |
| 5,037,778 A | 8/1991 | Stark et al. |
| 5,050,838 A | 9/1991 | Beatty et al. |
| 5,054,522 A | 10/1991 | Kowanz et al. |
| 5,058,856 A | 10/1991 | Gordon et al. |
| 5,061,914 A | 10/1991 | Busch et al. |
| 5,064,165 A | 11/1991 | Jerman |
| 5,065,978 A | 11/1991 | Albarda et al. |
| 5,066,533 A | 11/1991 | America et al. |
| 5,069,419 A | 12/1991 | Jerman |
| 5,074,629 A | 12/1991 | Zdeblick |
| 5,082,242 A | 1/1992 | Bonne et al. |
| 5,096,643 A | 3/1992 | Kowanz et al. |
| 5,116,457 A | 5/1992 | Jerman |
| 5,131,729 A | 7/1992 | Wetzel |
| 5,133,379 A | 7/1992 | Jacobsen et al. |
| 5,142,781 A | 9/1992 | Mettner et al. |
| 5,161,774 A | 11/1992 | Engelsdorf et al. |
| 5,169,472 A | 12/1992 | Goebel |
| 5,176,358 A | 1/1993 | Bonne et al. |
| 5,177,579 A | 1/1993 | Jerman |
| 5,178,190 A | 1/1993 | Mettner |
| 5,179,499 A | 1/1993 | MacDonald et al. |
| 5,180,623 A | 1/1993 | Ohnstein |
| 5,197,517 A | 3/1993 | Perera |
| 5,209,118 A | 5/1993 | Jerman |
| 5,215,244 A | 6/1993 | Buchholz et al. |
| 5,216,273 A | 6/1993 | Doering et al. |
| 5,217,283 A | 6/1993 | Watanabe |
| 5,238,223 A | 8/1993 | Mettner et al. |
| 5,244,537 A | 9/1993 | Ohnstein |
| 5,267,589 A | 12/1993 | Watanabe |
| 5,271,431 A | 12/1993 | Mettner et al. |
| 5,271,597 A | 12/1993 | Jerman |
| 5,309,943 A | 5/1994 | Stevenson et al. |
| 5,325,880 A | 7/1994 | Johnson et al. |
| 5,333,831 A | 8/1994 | Barth et al. |
| 5,336,062 A | 8/1994 | Richter |
| 5,355,712 A | 10/1994 | Petersen et al. |
| 5,368,704 A | 11/1994 | Madou et al. |
| 5,375,919 A | 12/1994 | Furuhashi |
| 5,400,824 A | 3/1995 | Gschwendtner et al. |
| 5,417,235 A | 5/1995 | Wise et al. |
| 5,445,185 A | 8/1995 | Watanabe et al. |
| 5,458,405 A | 10/1995 | Watanabe |
| 5,556,703 A | 1/1996 | Watanabe et al. |
| 5,553,790 A | 9/1996 | Findler et al. |
| 5,577,533 A | 11/1996 | Cooks, Jr. |
| 5,785,295 A * | 7/1998 | Tsai ........................... 251/11 |
| 5,810,325 A | 9/1998 | Carr |
| 5,838,351 A | 11/1998 | Weber |
| 5,848,605 A | 12/1998 | Bailey et al. |
| 5,873,385 A | 2/1999 | Bloom et al. |
| 5,909,078 A | 6/1999 | Wood et al. |
| 5,926,955 A | 7/1999 | Kober |
| 5,941,608 A | 8/1999 | Campau et al. |
| 6,019,437 A * | 2/2000 | Barron et al. ............ 303/113.1 |
| 6,105,737 A | 8/2000 | Weigert et al. |
| 6,386,507 B2 | 5/2002 | Dhuler et al. |
| 6,523,560 B1 | 2/2003 | Williams et al. |
| 6,761,420 B2 | 7/2004 | Maluf et al. |
| 6,845,962 B1 | 1/2005 | Barron et al. |
| 7,011,378 B2 * | 3/2006 | Maluf et al. ............. 303/119.2 |

FOREIGN PATENT DOCUMENTS

| | | |
|---|---|---|
| DE | 29 30 779 | 2/1980 |
| DE | 34 01 404 A1 | 7/1985 |
| DE | 41 01 575 A1 | 7/1992 |
| DE | 44 17 251 A | 11/1995 |
| DE | 44 22 942 A1 | 1/1996 |
| EP | 0 250 948 | 1/1988 |
| EP | 0 261 972 A2 | 3/1988 |
| EP | 0 261 972 B1 | 3/1988 |
| GB | 2238267 A | 5/1991 |
| WO | WO-99/16096 A1 | 4/1999 |
| WO | WO 00/14415 A2 | 3/2000 |
| WO | WO 00/14415 A3 | 3/2000 |
| WO | WO-01/71226 A2 | 9/2001 |
| WO | WO-01/71226 A3 | 9/2001 |

OTHER PUBLICATIONS

Ayon, A. A. et al. (Jun. 1998). "Etching Characteristics and Profile Control in a Time-Multiplexed ICP Etcher," *Proc. of Solid State4 Sensor and Actuator Workshop Hilton Head SC* pp. 41-44.

Bartha, J. W. et al. (1995). "Low Temperature Etching of the Si in High Density Plasma Using $SF_6/O_2$," *Microelectronic Engineering* 27:453-456.

Carpenter Technology Corporation Technical Data Sheet for Carpenter Low Expansion: 42®, dated Nov. 1980, located at http://www.carpenter.idesinc.com,last visited on Mar. 8, 2002, 4 pages total.

Delphi Automative Systems product brochure (1997). Variable Bleed Actuator (VBS) for Transmission, 2 pages.

Delphi Automative Systems product brochure (1998). On/Off Transmission Solenoids, 2 pages total.

Duffy, J. E. (1994). "Automatic Transmission Fundamentals," Modern Automotive Technology, p. 707.

Eaton Corporation. "Eaton Automotive—Products and Services," Located at http://www.autocontrols.eaton.com, last visited on Mar. 2, 2005, 1 page.

Fung, C. D. et al. (Nov. 7-8, 1984). "Deep Etching of Silicon Using Plasma," *Proceedings of the Workshop on Micromachining and Micropackaging of Transducers*, pp. 159-164.

Houston, P. N. et al. (Jun. 1-4, 1999). "Low Cost Flip Chip Processing and Reliability of Fast-Flow, Snap-Cure Underfills," 1999 Electronic Components and Technology :Conference. San Diego, CA pp. 61-70.

International Search Report (Mar. 15, 2000), PCT/US99/19971.

Jonsmann, J. et al. (Jan. 17-21, 1999). "Compliant Electro-Thermal Microactuators," *Twelfth IEEE International Conference on Mico*

*Electro Mechanical Systems* Orlando, Florida, IEEE Technical Digest entitled IEEE Catalog No. 99CH3629C pp. 588-593.

Klassen, E. H. et al. (1995). "Silicon Fusion Bonding and Deep Reactive Ion Etching: A New Technology for Miscrostructures," *Proc. Tranducers 95 Stockholm Sweden* pp. 556-559.

Konarski, M. M. (May 31 to Jun. 4, 1998), "Cure Parameter Effects on the Tg and CTE of Chip Encapsulants," *43rd International SAMPE Symposium and Exhibition. Materials and Process Affordability, Keys to the Future.* Anaheim, CA vol. 1 pp. 823-832.

Linder, C. et al. (Jun. 1991). "Deep Dry Etching Techniques as a New IC Compatible tool for Silicon Mocromachining," *Proceedings Transducers '91*, pp. 524-527.

Madou, M. (1997). "Scaling Laws, Actuators, and Power in Miniaturization," Chapter 9 In *Fundamentals of Microfabrication* CRC Press LLC: Boca Raton, FL pp. 405-446.

Noworolski, J. M. et al. (1996). "Process For In-plane and Out-Of-Plane Single-Crystal-Silicon Thermal Microactuators," *Sensors and Actuators* A55:65-69.

Ohio State University Chemistry Department brochure page on Marc J. Madou [online]. Ohio State University [retrieved on Dec. 31, 2000]. Retrieved from the Internet: <http//www.chemistry.ohio>, last visited on Mar. 28, 2002 pages.

Petersen, K. E. et al. (Jun. 1991). "Surface Micromachined Structures Fabricated with Silicon Fusion Bonding," *Proceedings, Transducers' 91* pp. 397-399.

Qi, J et al. (Apr. 6-9, 1999). "Flip Chip on Laminate Manufacturability," *1999 International.*

*Conference on High Density Packaging and MCMs* Proc. SPEI—Int. Soc. Opt. Engl (USA), Denver, CO, pp. 345-352.

Williams, K. R. et al. (Jun. 7-10, 1999). "A Silicon Microvalve for the Proportional Control of Fluids," *Transducers '99* Sendai, Japan, pp. 1804-1807.

Yunkin, V. A. et al (1994). "Highly Anistropic Selective Reactive Ion Etching of Deep Trenches in Silicon," *Microelectronic Engineering* 23:373-376.

* cited by examiner

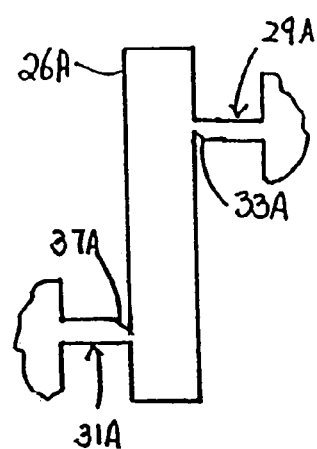
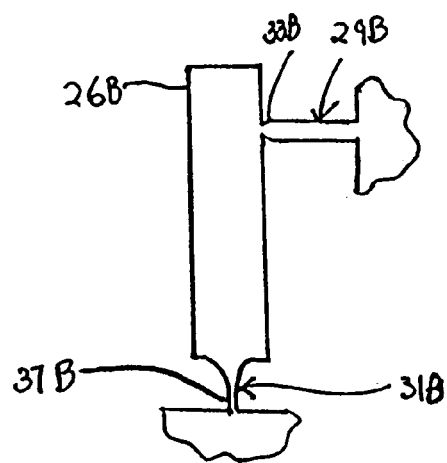
FIG. 6A
FIG. 6B
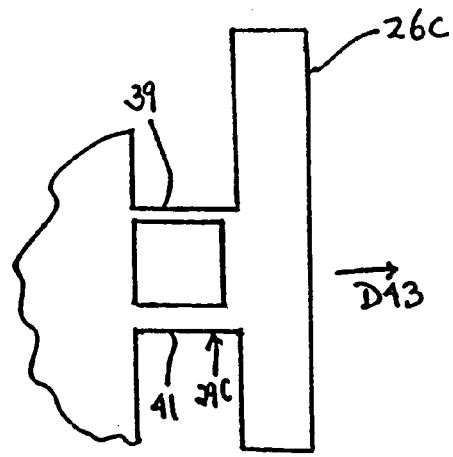
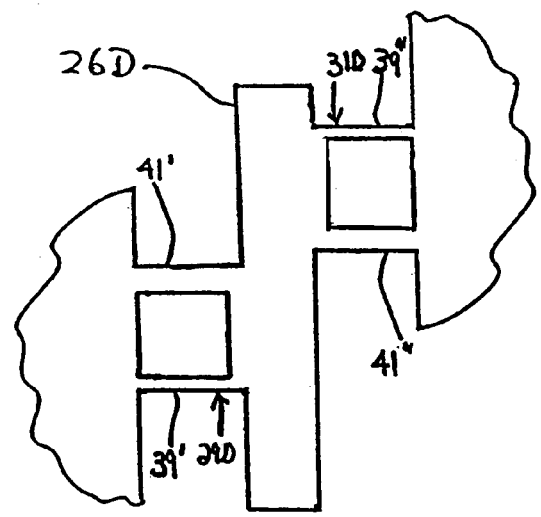
FIG. 6C
FIG. 6D

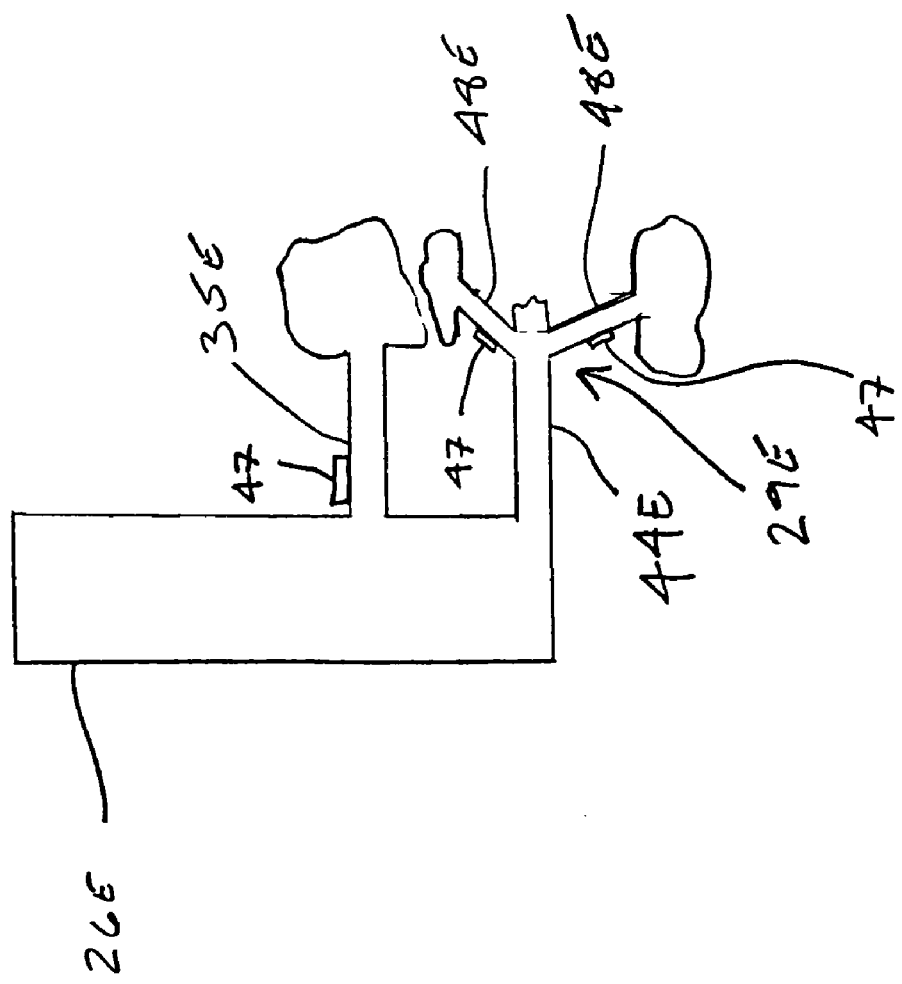

PROPORTIONAL MICROMECHANICAL VALVE

CROSS-REFERENCE TO RELATED APPLICATIONS

This application is a continuation of U.S. Ser. No. 10/024,957, filed Dec. 18, 2001, which is a continuation-in-part application of U.S. Ser. No. 09/148,026, filed on Sept. 3, 1998 now abandoned, which is pending and which is incorporated by reference in its entirety herein.

BACKGROUND OF THE INVENTION

1. Field of Invention

The present invention relates generally to semiconductor electromechanical microdevices and more specifically to microdevices with high aspect ratio geometries and a member displaceable in conjunction with a transducer.

2. Description of the Related Art

A fluid valve generally comprises a fluid port, an actuator, and a valve structure which is movable to open or close the fluid port in response to the actuator. There are numerous types of fluid valves. Examples of fluid valves include solenoid valves and microvalves fabricated from micromachined semiconductor materials such as bimetallic microvalves and encapsulated-fluid microvalves. However, numerous problems are associated with each of these types of valves or microvalves.

A solenoid valve utilizes a coil in the form of a cylinder and generally has a core which can be pulled into the cylinder by the magnetic field set up when current is passed through the coil. Solenoid valves are typically used in a conventional anti-lock brake system, for example. However, solenoid valves usually are relatively large and heavy. In addition, electromagnetic valves such as solenoid valves often require relatively high currents and may result in spiking of the voltage supply. Solenoid valves also can exhibit hysteresis and thus nonlinearity of response to electrical input. Furthermore, operation of electromagnetic valves such as solenoid valves can be relatively slow due to a relatively large lag time between the delivery of current to such valve and the resultant magnetic field and corresponding force. It is also difficult in practice to only partially open or close a solenoid valve and so solenoid valves are typically used only as on/off rather than proportional valves.

An exemplary bimetallic microvalve utilizes an actuator made of two materials with different coefficients of thermal expansion. The difference in coefficients of thermal expansion causes the actuator to bend or straighten upon heating or cooling of the actuator to thereby open or close a flow orifice. U.S. Pat. No. 5,058,856 discloses such a bimetallic microvalve which has a first and a second substrate. A first substrate defines a flow orifice and a valve seat. A second substrate defines a valve face aligned with the flow orifice and also defines movable actuators. The movable actuators include first and second layers of materials with substantially different coefficients of thermal expansion, such as a silicon layer and a nickel layer. The actuators also include heating elements and are fixed at one end such that selective heating of the actuators causes the actuators to flex due to the difference in the coefficients of thermal expansion. Flex of the actuators displaces the valve face away from or towards the valve seat to open or close the valve and thereby control fluid flow through the orifice.

However, one problem associated with such bimetallic microvalves is that, because the actuator actuates in response to changes in temperature, changes in ambient temperature can unintentionally actuate the microvalve. In addition, the heated element, the actuator, is in contact with the fluid flow and thus may undesirably heat the fluid in the flow path, cool the heater and displace the actuator.

An example of encapsulated-fluid microvalve is disclosed in U.S. Pat. No. 4,824,073. Encapsulated-fluid microvalves utilize the principle of expansion and pressure rise of a fixed amount of fluid or gas in an enclosed cavity when heated to deflect a flexible thin membrane or diaphragm forming one or more walls of the cavity. When the encapsulated fluid or gas is heated, the diaphragm is deflected to open or close a port to control fluid flow through a fluid orifice. Heating the encapsulated fluid or gas may be accomplished by a resistive heating element within the cavity such that electrical current may be passed through the resistive element to generate heat to heat the fluid or gas.

Encapsulated-fluid microvalves can generate relatively large forces such that they may be used as mass fluid controllers, for instance, to control high volume of fluid flow. In addition, encapsulated-fluid microvalves may also be operated proportionally to provide a proportional range of fluid control, i.e. the valve may be controlled to modulate the rate of fluid flow through the valve in accordance with the magnitude of a control signal.

However, encapsulated-fluid microvalves have a relatively slow response time due to the time required for heating and cooling of the fluid. Further, the deflecting membrane of an encapsulated-fluid microvalve is in contact with the fluid or gas flow path. Thus, the temperature of the deflecting membrane may affect the temperature of the fluid or gas in the flow path, and vice versa. Additionally, as with bimetallic actuators, encapsulated fluid actuators are unintentionally activated by ambient temperature changes.

Further, none of the valves described above provides flow-force and/or pressure-force compensation to minimize the effect of fluid flow through the microvalve. As such, operating the above-described valves at high pressures (e.g. above 300 psi) may be problematic.

Thus, there has been a need for a microvalve which is small, light weight, cost effective, simple to fabricate, which has a quick response time and can control high pressure fluid flow. There has also been a need for a microvalve which provides precise and proportional flow control wherein response to a control stimulus input is substantially linear, without hysteresis and with flow-force and/or pressure-force compensation to minimize the effect of fluid flow through, and pressure on, the microvalve. There also has been a need for a valve in which operation of the valve does not result in significant heating of the fluid or gas that flows through the valve. Furthermore, there has also been a need for a microvalve which functions independently of the ambient temperature. The present invention meets these needs.

SUMMARY OF THE INVENTION

In one aspect of the invention, a semiconductor micromechanical device generally comprises a first generally planar layer and a second generally planar semiconductor layer. A first and a second member extend from the second layer, and each is suspended within a cavity defined by the second layer. The first layer may also define a portion of the cavity. A displaceable structure is suspended from the first and second suspended members within the cavity. An actuator is operatively coupled to the first suspended member such that the actuator can impart a force that causes displacement of the displaceable member.

In another aspect of the invention, a microstructure of the present invention may be utilized as a microvalve including first, second and third layers is provided, wherein the second layer is secured between the first and third layers. All three layers are preferably made of substantially the same material. The first layer and/or the third layer may define inlet and outlet ports. The second layer defines a flow area enclosed by the first and third layers to permit fluid flow between the inlet and outlet ports, a displaceable member, and one or more actuators for actuating the displaceable member to open and close the microvalve. The displaceable member and the one or more actuators are suspended between the first and third layers. The second layer is preferably highly doped to have a low resistivity. Electrical contacts for the actuators are preferably provided through the third layer. In operation, an electrical current is driven through the actuators via the electrical contacts, causing the actuators to become heated and to thermally expand. The actuators are disposed relative to the displaceable member such that thermal expansion of the actuators causes the displaceable member to be displaced in the plane of the second layer to a position between an open and closed position relative to one of the inlet and outlet ports. The displaceable member has a high aspect ratio (the ratio of height to width) and thus is compliant in the plane of the layers and very stiff out of the plane.

The microdevice of the present invention is compact and easy to manufacture. It can respond rapidly to an input stimulus with a linear response substantially without hysteresis. More specifically a small displaceable semiconductor structure is suspended from a semiconductor layer such that it can move with precision in the plane of the layer in response to an input stimulus. The displaceable structure can serve as a valve which opens and closes fluid ports without heating fluid as it flows through the ports. Because the layers have a matched coefficient of thermal expansion, ambient temperature does not influence movement of the displaceable semiconductor structure.

These and other features and advantages of the invention will be appreciated from the following detailed description in conjunction with the drawings.

BRIEF DESCRIPTION OF THE DRAWINGS

FIGS. 4, 5A, 5B and 6A-6E show top plan views of alternative configurations of actuators;

DETAILED DESCRIPTION OF THE PREFERRED EMBODIMENTS

The present invention comprises a semiconductor micromechanical device which includes a semiconductor layer defining a cavity. A displaceable structure is suspended within the cavity by first and second members which also are suspended within the cavity. At least one of the suspended members is operative as an actuator which can displace the displaceable structure within the cavity. The following description is presented to enable any person skilled in the art to make and use the invention. Descriptions of specific applications are provided only as examples. Various modifications to the preferred embodiment will be readily apparent to those skilled in the art, and the general principles defined herein may be applied to other embodiments and applications without departing from the spirit and scope of the invention. Thus, the present invention is not intended to be limited to the embodiments shown, but is to be accorded the widest scope consistent with the principles and features disclosed herein.

Figure 1:
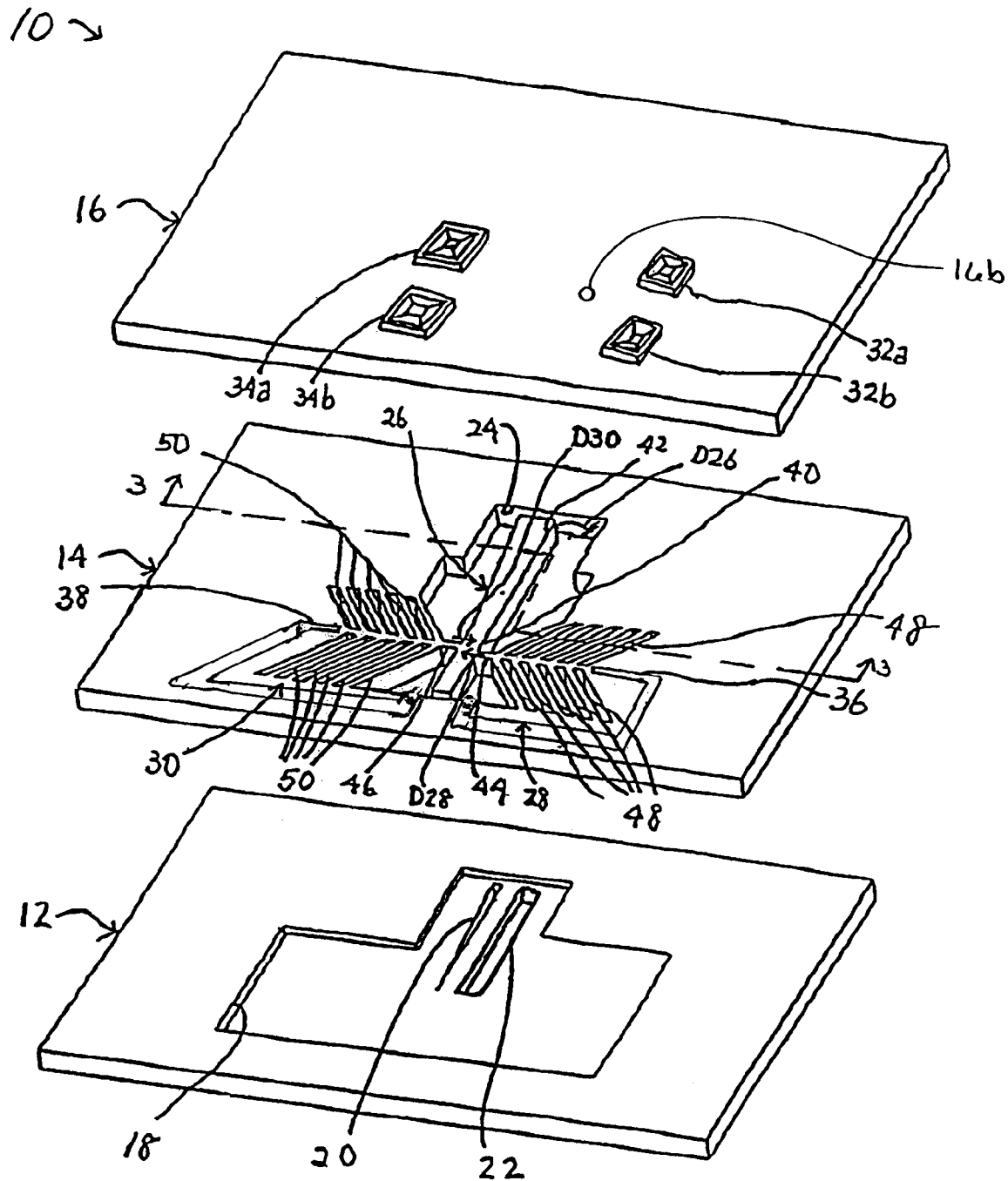
FIG. 1 shows an exploded perspective view of the first, second and third layers of the proportional microvalve of a present embodiment of the invention.
Figure 2:
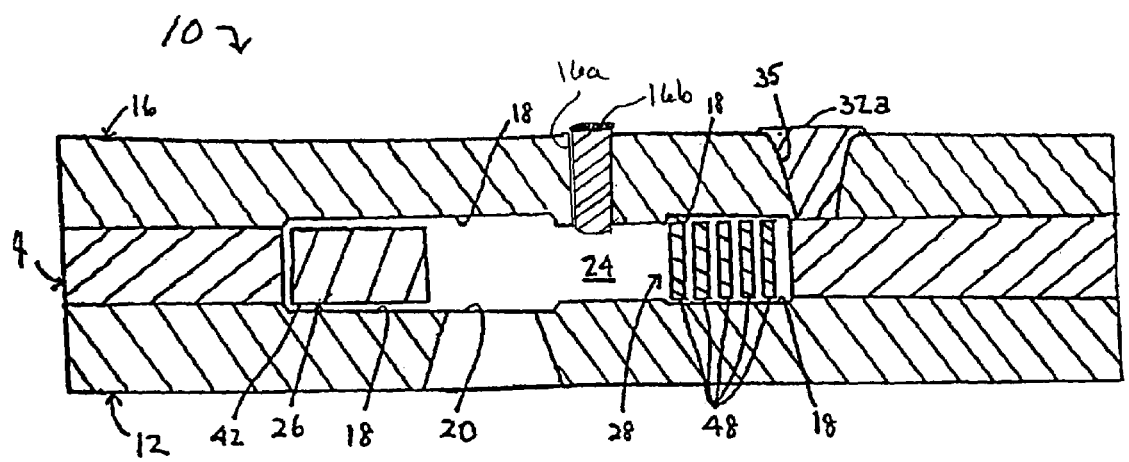
FIG. 2 shows a cross sectional view along line 3-3 of FIG. 1.

Referring to the illustrative drawings of FIGS. 1 and 2, there is shown a presently preferred first embodiment of a microvalve 10 in accordance with the invention. The microvalve 10 of the first embodiment generally comprises three layers or substrates: first layer 12, second layer 14 and third layer 16. The first layer 12 defines inlet port 20 and outlet port 22. The second layer 14 is secured between first layer 12 and third layer 16, and defines a cavity 24 including a flow area to permit fluid flow between inlet port 20 and outlet port 22. The second layer 14 further defines a displaceable member 26 which can be displaced in response to thermal actuators 28, 30 to open and close inlet port 20. In the present embodiment, the displaceable member 26 is elongated. Electrical contacts 32a, 32b, 34a, 34b for electrical thermal heating of actuators 28, 30, respectively, are provided in vias through the third or cap layer 16.

When an input such as current is applied through each of actuators 28, 30 via electrical contacts 32a-b, 34a-b, each of actuators 28, 30 exerts a force in a direction indicated by arrows D28 and D30, respectively. Forces in directions D28 and D30 cause displaceable member 26 to be displaced in a direction indicated by arrow D26 such that at least a portion of displaceable member 26 becomes vertically aligned with inlet port 20. The current, therefore, serves as an input stimulus which actuates the actuators. The at least partial vertical alignment of displaceable member 26 relative to the inlet port 20 at least partially closes the inlet port 20. The amount of the displacement or alignment of displaceable member 26 may be selected to control, for example, the rate of fluid flow. When the input is no longer applied through actuators 28, 30, actuators 28, 30 exert forces in directions opposite to those indicated by arrows D28 and D30, respectively, to return displaceable member 26 to its normally open position relative to the inlet port 20 by displacing displaceable member 26 in a direction opposite to that indicated by arrow D26.

Alternatively, microvalve 10 may be configured such that displaceable member 26 is in a normally closed position relative to the inlet port 20 and is displaceable to open inlet port 20. In another alternative embodiment, microvalve 10 may be configured such that displaceable member 26 is in a normally open or closed position relative to the outlet port 22 and is displaceable to close or open the outlet port 22.

Preferably, each of first, second and third layers 12, 14, 16 is made of silicon or other semiconductor materials. Alternatively, first and/or third layers 12, 16 may be made of glass (Pyrex), conductive ceramic, steel, aluminum, and/or any other metallic or conductive materials. The second layer 14 is preferably a single-crystal semiconductor (SCS) as it is strong, flexible and more resistant to performance degradation.

Although the microvalve is generally described herein as opening and closing inlet port 20, such description is solely for illustrative purposes only and, clearly, microvalve 10 can be easily adapted to open or close outlet port 22. Further, although microvalve 10 is described herein as a normally open (N.O.) valve, it can be easily adapted to be a normally closed (N.C.) valve. In addition, for purposes of clarity and brevity of the description herein, only actuator 28 and corresponding electrical contacts 32a, 32b will generally be described, although the description is correspondingly applicable to actuator 30 and electrical contacts 34a, 34b.

First and third layers 12, 16 preferably define shallow recesses 18, although only recess 18 in first layer 12 is shown in FIG. 1. Recesses 18 are defined in regions aligned with displaceable member 26 and actuators 28, 30 of second layer 14 to provide clearance for suspension of displaceable member 26: and actuators 28, 30 between first and third layers 12, 16 and for displacement thereof within cavity 24 in the plane of the second layer 14. Recesses 18 may also be defined in regions aligned with cavity 24 to further facilitate fluid flow through cavity 24. Alternatively or additionally, displaceable member 26 and actuators 28, 30 of second layer 14 may be indented, or thinned, (not shown) from first and third layers 12, 16 to provide clearance therebetween. In addition, recesses 18 and/or the indents of displaceable member 26 and actuators 28, 30 may be of a uniform depth or varying depths. For example, in one embodiment, recess 18 and/or indents may provide a clearance of approximately 0.5 μm in the region near inlet 20 between displaceable member 26 and each of first and third layers 12, 16 in order to minimize fluid leakage by reducing the distance between displaceable member 26 and inlet port 20 when displaceable member 26 is aligned over inlet port 20 to close off fluid flow. In addition, recess 18 and/or indents may provide a clearance of approximately 10-100 μm or less in other regions such as those between actuators 28, 30 and each of first and third layers 12, 16 to reduce the heat-loss rate and, thus, the power for continuous operation.

Where microvalve 10 is utilized as a liquid valve, recesses 18 of the first embodiment preferably has a depth of approximately 0.5 μm. Thus, a gap is formed between a surface of recess 18 and stopper end portion 42 when displaceable member 26 is in a closed position. Liquid leakage through microvalve 10, even with such a gap, is minimal. This small leakage has already been demonstrated by a larger 5 μm gap in a conventional solenoid fluid valve currently utilized for anti-lock brake systems. Thus, provision of recesses 18 approximately 0.5 μm in depth for a fluidic microvalve is preferred in certain applications.

The second layer 14 is preferably doped, more preferably highly doped, for example, a highly doped P-type single-crystal semiconductor (SCS). By doping, second layer 14 has a low resistivity. Low resistivity facilitates high current flow through thermal actuators 28, 30. Current may be applied through actuators 28, 30 via contacts 32a, b and 34a, b, respectively. By increasing the current applied to contacts 32a, b and 34a, b, thermal expansion of actuators 28, 30 increases resulting in an increase of the forces exerted by actuators 28, 30 on the displaceable member 26.

For example, the resistivity p of second layer 14 is preferably approximately 0.001-0.1 Ωcm such that a current flow from one side to the other side of ribs 48 results in a desirable amount of heating of and heat dissipation by the ribs. Where ribs 48 are silicon, ribs 48 can withstand temperatures of up to 1100° C. and preferably up to approximately 500° C. Preferably, silicon ribs 48 are heated by between 10° C. and 500° C., and more preferably between 100° C. to 200° C. As is evident, actuation of microvalve 10 is dependent upon the heating of ribs 48 relative to the temperature of the remainder of the microvalve 10 and is independent of the ambient temperature.

Electrical contacts 32a-b are provided in third layer 16 and are vertically aligned with thermal actuator 28. Electrical contacts 32a-b provide electrical contact, through vias 35, for the application of current to actuators 28. The ribs 48 serve as conductive paths through the highly doped second layer 14 between contacts 32a and 32b. Contacts 32a-b are preferably in electrical contact with regions of second layer 14 that are isolated except for current conduction paths formed by ribs 48. Such electrical isolation may be established by providing trenches 36 in the second layer 14 to prevent a short circuit between electrical contacts 32a and 32b. Trenches 36 may be filled with a dielectric material to planarize trenches 36. In addition, electrical isolation from the fluid may be established by oxidizing the ribs 48.

Electrical isolation between first and second layers 12, 14 and between second and third layers 14, 16 is achieved because the first and third layers 12, 16, unlike second layer 14, have a low doping level and are only minimally electrically conductive, such that the applied current remains in second layer 14. Where the layers 12, 14, 16 comprise silicon, the surface of the layers 12, 14, 16 may also be oxidized to provide further electrical isolation.

Additionally, as shown in FIGS. 1 and 2, an opening 16a may be formed through layer 16 and a pressure sensor 16b placed in a fluid-tight manner in opening 16a. This allows a measurement to be made of the pressure difference between the inlet 20a and outlet 72. Such pressure sensors 16b are well known in the art.

It will be noted that the electrical contacts 32a, 32b are vertically aligned with the ribs 48 of actuator 28 such that one of the contacts (e.g., 32a) is vertically aligned with the ribs on one side of the isolation trench 36 and the other of the contacts (e.g., 32b) is vertically aligned with the ribs on the other side of the trench 36. The contacts 34a, 34b are similarly vertically aligned with the ribs 50 of the actuator 30. It will be appreciated that such vertical alignment provides a more compact microvalve.

The displaceable member 26 has a first actuator end portion 40 in contact with thermal actuators 28, 30 and a second stopper end portion 42 disposed and shaped for opening and closing inlet port 20. The displaceable member 26 can, but does not necessarily, increase in cross-sectional area from the first actuator end portion 40 to stopper end portion 42.

In a present embodiment, each of actuators 28, 30 comprises a shaft 44, 46 with ribs 48, 50 extending therefrom, respectively, wherein shafts 44, 46 are generally perpendicular to the displaceable member 26. Thus, applying a current through ribs 48 causes them to thermally expand which in turn causes shaft 44 to exert a force on the displaceable member 26 in a direction as indicated by arrow D28. Thus, it will be appreciated that in the present embodiment the shaft 44, 46 an ribs 48, 50 constitute a unitary structure that serves both to suspend the displaceable member 26 within the cavity 24 and to impart displacement force to the displaceable member 26.

In addition, although thermal actuators 28, 30 are disposed in cavity 24 to be filled with fluid, thermal actuators 28, 30 are preferably disposed outside of the area of fluid flow between inlet and outlet ports 20, 22. The fluid in the area outside of the fluid flow area would generally be stagnant and, essentially, a vacuum would be needed to remove this dead volume of fluid. Thus, where the fluid is a thermal insulator the dead volume of fluid may also act as a thermal insulator between thermal actuators 28, 30 and the fluid flow to prevent the fluid flow from being heated thereby.

Actuators 28, 30 and displaceable member 26 are suspended within the cavity 24 between first and third layers 12, 16. Specifically, ribs 48 are anchored or fixed at one end to second layer 14 such that ribs 48 are suspended by second layer 14 between first and third layers 12, 16. Shaft 44 and displaceable member 26 are in turn similarly suspended, the shaft 44 being supported by ribs 48 and the displaceable member 26 being supported by shafts 44, 46. Furthermore, thermal actuators 28, 30 have high aspect ratios (the ratio of height to width) formed by deep reaction ion etching (DRIE). Thermal actuators 28, 30 preferably have aspect ratios in the range of 1:1 to 50:1, and more preferably approximately 20:1. The displaceable member 26 preferably has an aspect ratio in the range of 0.5:1 to 50:1, and more preferably approximately 1:1. Thus, each of suspended ribs 48, shaft 44 and displaceable member 26 is displaceable in the plane of second layer 14 while limited in the direction of displacement by the respective support structure.

Figure 3:
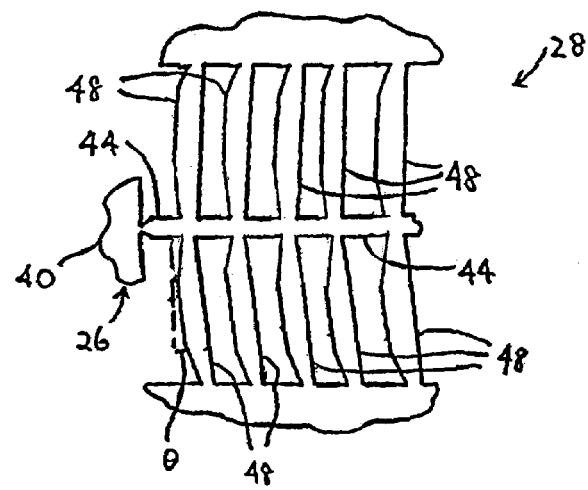
FIG. 3 shows a top plan view of an actuator having plates or ribs.

Actuator 28 is shown in more detail in FIG. 3. Because ribs 48 are anchored at one end to second layer 14, ribs 48 cannot thermally expand toward the anchored end. Rather, ribs 48 can thermally expand toward shaft 44. Each end of rib 48 is preferably tapered to achieve a smaller cross-section at the junctions between rib 48 and second layer 14 and/or between rib 48 and shaft 44. The tapered junctions allow hinging action and thus allow displacement of shaft 44. In addition, ribs 48 are at an angle θ relative to the perpendicular of shaft 44 such that upon thermal expansion of ribs 48, ribs 48 displace shaft 44 toward first actuator end portion 40 of displaceable member 26. Rib angle θ, for purposes of amplifying the displacement of shaft 44, is preferably relatively small, for example, between 1 and 5°. However, it is considered that rib angle θ extend to 30° or more. A small angle θ maximizes the displacement of shaft 44 toward actuator end portion 40 of displaceable member 26 for a given amount of thermal expansion of each rib 48.

To increase the force shaft 44 exerts on actuator end portion 4 of displaceable member 26, additional pairs of ribs 48 may be provided. For example, actuator 28 may have five pairs of ribs 48 as shown in FIGS. 1 and 2. Clearly, the number of rib pairs may be easily varied to achieve the desired force exerted on stopper end portion 42 of displaceable member 26. Preferably, ribs 48 are provided in pairs, one opposite the other relative to shaft 44, such that forces perpendicular to shaft 44 exerted by ribs 48 are canceled out by opposing ribs 48. Thus, the net force exerted by ribs 48 is parallel to shaft 44 and shaft 44 in turn exerts the forces on actuator end portion 40 of displaceable member 26.

In a presently preferred embodiment, each rib 48 is approximately 200-4000 μm in length, 50-200 μm in width and 400 μm in height and thus with an aspect ratio of approximately 2:1 to 8:1. Shaft 44 is preferably 0.5 to 2 mm in length and with an aspect ratio of approximately 5:1 to 10:1. In addition, displaceable member 26 is preferably approximately 2-6 mm in length, 250-1000 μm in width and 400 μm in height. Thus, providing 5 pairs of silicon ribs for each of actuators 28, 30 and applying a total current of 20 amps through ribs 48, 50 result in approximately 1 N of force exerted by shafts 44, 46 onto actuator end portion 40 of displaceable member 26. This force translates to approximately 0.1 N of force and 150-200 μm of displacement at stopper end portion 42 of displaceable member 26. A displacement of approximately 400 μm at stopper end portion 42 of displaceable member 26 can be easily achieved with microvalve 10 of similar dimensions. Such a microvalve can have a switching time of less than 10 ms, can withstand up to approximately 5 kpsi of fluid pressure with pressure balancing of displaceable member 26 as will be discussed and can accommodate over 0.5 liters per minute of fluid flow.

Shafts 44, 46 of thermal actuators 28, 30 are disposed relative to displaceable member 26 to exert displacement torque force on actuator end portion 40 upon displacement of shafts 44, 46 toward actuator end portion 40. In the present embodiment, the displaced force essentially is a torque force about a locus of member 26 between the first and second shafts 44, 46 as illustrated by arrow D26. As shown in FIG. 1, actuators 28, 30 are preferably disposed on opposing sides of displaceable member 26 and offset relative to each other along the axial length of displaceable member 26. The offset distance may be selected according to the desired torque force at and displacement of stopper end portion 42 of displaceable member 26. As there must be a conservation of energy, the displacement of shaft 44 is generally inversely proportional to the force exerted by shaft 44. In other words, a larger offset distance would result in a greater displacement force at and a smaller displacement of stopper end portion 42. On the other hand, a smaller offset distance would result in a smaller torque force at and a greater displacement of stopper end portion 42. Thus, the distance by which thermal actuators 28, 30 are offset from each other along the axial length of displaceable member 26 may be selected to achieve the desired balance between torque and displacement.

To actuate thermal actuator 28, a current is applied between electrical contacts 32a, 32b to heat ribs 48, causing ribs 48 to thermally expand. Thermal expansion of ribs 48 operates to displace shaft 44 toward the first actuator end portion 40 of displaceable member 26. Similarly, a current is simultaneously applied between electrical contacts 34a, 34b to heat ribs 50, causing ribs 50 to thermally expand. Thermal expansion of ribs 50 also displaces shaft 46 toward actuator end portion 40 of displaceable member 26. Because shafts 44, 46 are offset from each other along the axial length of displaceable member 26, displaceable member 26 is displaced in the plane of second layer 14 at a locus of displaceable member 26 approximately midway between shafts 44, 46. Displacement of displaceable member 26 causes the second stopper end portion 42 to be displaced relative to inlet port 20 to open or close inlet port 20.

Because the relationship between the amount of power applied and the extent of displacement second stopper end portion 42 of displaceable member 26 relative to inlet port 20 is generally without hysteresis, the amount of the applied current can be controlled to control the level of fluid flow through microvalve 10. Controlling the applied current, and thus the power, controls the extent of thermal expansion of ribs 48, 50, the displacement of shafts 44, 46, the rotation of displaceable member 26, and thus the displacement of the second stopper end portion 42 relative to inlet port 20. Thus, the proportional extent to which stopper end portion 42 of displaceable member 26 opens and closes flow through inlet port 20 and the resultant fluid flow through microvalve 10 can be precisely controlled by controlling the amount of the applied current. Alternatively, the current applied to the microvalve can be pulsed to open and close the port. With pulse-width modulated input signals timed for the same average power delivery and thus the same heating, the desired overall fluid flow rate can thereby be achieved.

The shape of inlet port 20 may be similar to the shape of stopper end portion 42 of displaceable member 26, as shown in FIG. 1. Such a shape maximizes the area of inlet port 20 exposed by a given displacement of stopper end portion 42 of displaceable member 26, i.e. minimizes the displacement of stopper end portion 42 of displaceable member 26 to expose a given area of inlet port 20. Outlet port 22 may be of any suitable shape and is preferably of a maximal size given the configuration of the microvalve 10 so as to minimize the pressure drop across outlet port 22. Of course, any other suitable shape and sizes of inlet port 20 and outlet port 22 may be utilized and inlet port 20 and outlet port 22 may be of different shapes.

After current is no longer applied to electrical contacts 32a, 32b, the actuator is allowed to passively cool and return displaceable member 26 to its open position. Alternatively, where two or more actuators are used, one actuator may be used to open and the other actuator may be used to close the microvalve 10 as in the configuration of FIG. 5B. It is desirable to provide a heat sink (not shown), comprising any thermally conductive metal or ceramic, such as aluminum, for example, attached to the bottom surface of the first layer 12.

Figure 4:
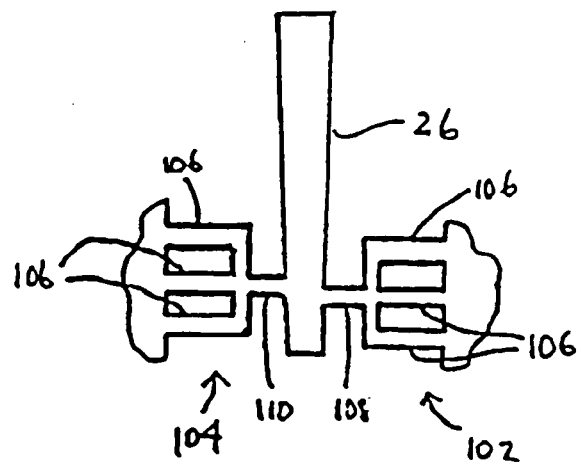

Alternative configurations of thermal actuators and displaceable members may be easily adapted and employed in the microvalve of the present invention. Thermal actuators and displaceable members should be designed to translate the force exerted by the thermal actuators to a displacement of displaceable member 26. For example, FIG. 4 shows a top plan view of alternative actuators 102, 104 and displaceable member 26. Each of actuators 102, 104 comprises two or more bars 106 connected to shafts 108, 110. Shafts 108, 110, similar to shafts 44, 46 of actuators 28, 30, are disposed on opposing sides of displaceable member 26 and offset from each other in order to exert a torque force on displaceable member 26. Clearly, displacement of each of shafts 108, 110 would be equal to the thermal expansion of bars 106 as there is no displacement amplification. Additional bars 106 may be provided to increase the force exerted by shafts 108, 110 upon displaceable member 26.

Figure 5A:
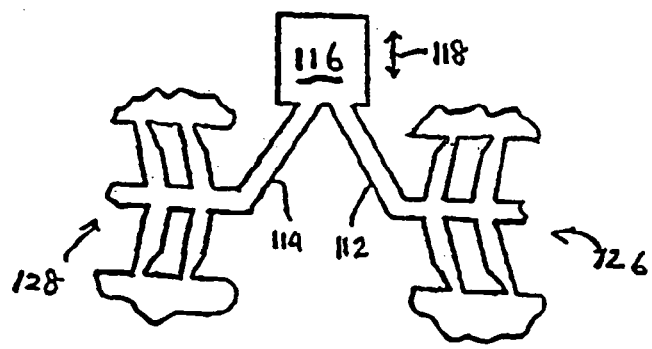

In another configuration as shown in FIG. 5A, two displaceable members 112, 114 are disposed at an angle relative to each of actuators 26, 28 for displacing stopper 116 in directions as indicated by arrow 118. The angle of displaceable members 112, 114 relative to shafts 44, 46, respectively, can be selected to amplify displacement of stopper 116. Increasing the displacement of stopper 116 would, however, decrease the force at stopper 116, as the relationship between displacement and force would of course also apply here.

Figure 5B:
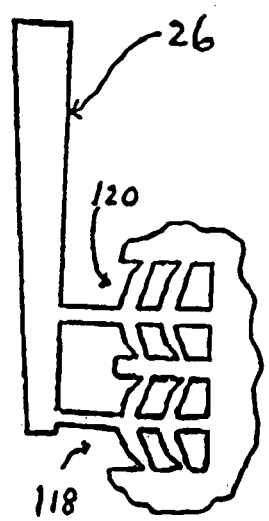

Alternatively, as shown in the partial top plan view of FIG. 5B, actuators 118, 120 may be disposed on the same side of displaceable member 26. In this configuration, displaceable member 26 may be displaced to open inlet port 20 by actuating only actuator 118. Employing only one actuator results in one half of the force and one half of the displacement of displaceable member 26. However, this configuration has the advantage that displaceable member 26 may be displaced to close inlet port 20 by actuating actuator 120, before actuator 118 has passively cooled and returned to its initial position. This is in contrast to configurations having actuators on opposite sides of the displaceable member which rely upon the passive cooling of the actuators to displace the displaceable member back to the closed position.

FIGS. 6A-6E show examples of other variations of actuator(s). As shown in FIG. 6A, the displaceable member 26A may be suspended by elements 29A, 31A. Either or both of the elements 29A and 31A may serve as expansible actuator. For example, actuator element 29A expands toward the displaceable member 26A upon actuation, the actuator element 29A displaces the member 26A about the anchor element 31A. Where both elements 29A, 31A serve as expansible actuators, actuation of both elements 29A, 31A displaces the member 26A about a pivot point along the displaceable member approximately midpoint relative to the elements 29A, 31A, depending upon the relative amount of expansions of the actuator elements. Of course, even when both elements 29A, 31A serve as actuators, either element may be actuated without the actuation of the other. Preferably, elements 29A, 31A define tapers 33A, 37A, respectively to facilitate displacement of the displaceable member 26A.

Alternatively, as shown in FIG. 6B, the displaceable member 26B may be suspended by element 29B and by the distal end portion 31B of the displaceable member. Preferably, only element 29B serves as an expansible actuator such that upon action, it expands toward the displaceable member 26B, displacing the member 26A about the distal end portion 31B. However, although not preferred, distal end portion 31B may also serve as an expansible actuator. Of course, even when both element 29B and distal end portion 31B serve as actuators, either element may be actuated without the actuation of the other. Preferably, element 29B defines a taper 33B to facilitate displacement of the displaceable member 26A relative to element 29B. Further, displaceable member 26B preferably also defines a taper 37B at the distal end portion 31B such that the cross-sectional area of displaceable member 26B generally decreases toward the distal end portion 31B.

Referring now to FIG. 6C, the displaceable member 26C may be suspended by a single actuator 29C, comprising extension arms 39 and 41. Extension arms 39 and 41 have different cross-sectional areas such that, for example, the cross-sectional area of extension arm 39 is less than that of extension arm 41. Because of the difference in the cross-sectional areas, the extension arm 39 has a higher resistance and thus greater thermal expansion upon actuation than those of extension arm 41. Thus, upon actuation of actuator 29C, the displaceable member 26C is displaced further by extension arm 39 than by extension arm 41 such that the member 26C is linearly displaced in direction D43 and rotated about a pivot at approximately the intersection of the expanded extension arm 41 and the displaceable member 26C. Although not shown, either or both of extension arms 39, 41 may provide a taper to facilitate displacement of the displaceable member 26C. In this variation, extension arms 39, 41 as well as displaceable member 26C are doped to allow the application and flow of current therethrough.

As shown in FIG. 6D, the displaceable member 26D may be suspended by two actuators 29D and 31D, disposed on either side of member 26D. Actuator 29D comprises extension arms 39' and 41' having different cross-sectional areas such that the cross-sectional area of extension arm 39' is less than that of extension arm 41'. Similarly, actuator 31D comprises extension arms 39" and 41" having different cross-sectional areas such that the cross-sectional area of extension arm 39" is less than that of extension arm 41". Extension arms 39 and 39' and/or extension arms 41 and 41' may or may not have the same cross-sectional area. As described above, because of the difference in the cross-sectional areas, extension arms 39', 39" has higher resistances and thus greater thermal expansions upon actuation than those of extension arms 41', 41", respectively.

Further, actuators 29D and 31D are preferably disposed such that extension arm 41' is closer to extension arm 41" than to extension arm 39" and extension arm 41" is closer to extension arm 41' than to extension arm 39'. Thus, upon actuation of actuators 29D and 31D, the displaceable member 26D is displaced further by extension arms 39', 39" than by extension arms 41', 41", respectively, such that the member 26D is rotated about a pivot at approximately the midpoint between actuators 29D and 31D. Although not shown, any or all of extension arms 39', 39", 41', 41" may provide a taper to facilitate displacement of the displaceable member 26C. Similar to the variation shown in FIG. 6C, extension arms 39', 39", 41', 41" as well as displaceable member 26D are doped to allow the application and flow of current therethrough.

Yet another embodiment of the present invention is shown in FIG. 6E. As shown in FIG. 6E, a displaceable member 26E is supported by a fixed, anchor element 35E and an actuator 29E. Actuator 29E includes a shaft 44E interconnected with two ribs 48E which are extendible in a direction parallel to the rib in response to an electric signal. Ribs 48E preferable extend from opposite sides of shaft 44E and at an angle thereto such that extension of ribs 48E causes shaft 44E to displace in a direction towards member 26E. Because shaft 44E is attached to displaceable member 26E, as shaft 44E is displaced, member 26E is pivoted about anchor element 35E causing an end of member 26E distal to shaft 44E to move in an opposite direction from the end of member 26E attached to shaft 44E. Alternately, ribs 48E could extend away from shaft 44E. Though only two ribs 48E are shown in FIG. 6E, it is considered that more than two ribs be included in actuator 29E. Additional ribs may extend from opposite sides of shaft 44E, as ribs 48E, and in a direction parallel to ribs 48E. Additionally any or all of extension arms 48E may provide a taper to facilitate displacement of the displaceable member 26E. Similar to the variation shown in FIG. 6C, extension arms 48E are preferably doped to allow the application and flow of current therethrough.

As also shown in FIG. 6E, one or more sensors 47 may, though need not, be integrally secured to the actuator to detect motion thereof. The sensor can be a device such as a piezoresistor, which changes its resistance upon the occurrence of changes in stress within a portion of the actuator, as when, for example, it bends, expands or contracts during activation and/or deactivation. For instance, as shown in FIG. 6E, the sensor 47 may be placed on a side surface of a rib or on anchor element 35E. The change in the piezoresistor's resistance may be utilized to sense the displacement or movement of the displaceable member.

As is evident, numerous other configurations of thermal or other types of actuators such as piezoelectric, electrostatic or pneumatic actuators, whichever is best suited for integration and displaceable members may be easily adapted and employed in microvalve 10 of the present invention to achieve a displacement of second stopper end portion 42. For example, one of the two actuators of the microvalve of FIG. 1 may be replaced by a single beam for anchoring and/or pivoting the displaceable member. The displaceable member thus may be rotated about a center of rotation or a pivot located along the displaceable member approximately halfway between the fixed beam and the shaft of the actuator. Thus, the displaceable member would be displaceable between an open and a closed position by thermal actuation of the only actuator.

Figure 7:
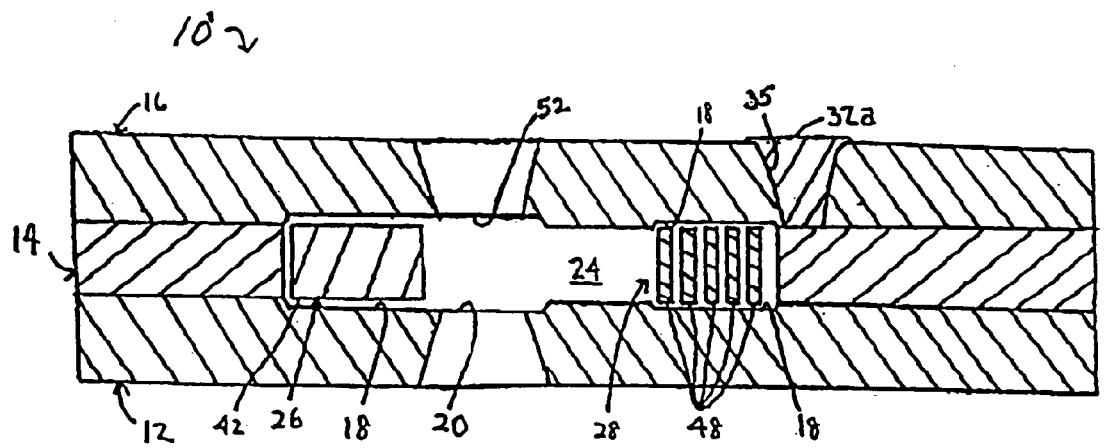
FIG. 7 shows a cross sectional view of a microvalve having a second inlet port with fluid entering from opposite sides of the microvalve to provide pressure balancing.

Referring now to FIG. 7, there is shown a cross-sectional view of an alternative embodiment in which the third layer 16 of microvalve 10' defines a second inlet port 52 disposed opposite inlet port 20 for fluid pressure balancing. Inlet port 20 and second inlet port 52 thus introduce fluid into cavity 24 such that the fluid impinges on opposite faces of stopper end portion 42 when displaceable member 26 is in the closed position or between the open and closed positions. This at least partially compensates or balances the fluid pressure exerted on the displaceable member resulting from fluid entering cavity 24. The fluid pressure exerted on stopper end portion 42 occurs when microvalve 10' is in the closed position or between the open and closed positions such that stopper end portion 42 is partially disposed in a region vertically aligned with inlet port 20. As fluid flows through inlet port 20, fluid impinges upon and exerts pressure on a surface of stopper end portion 42 adjacent first layer 12 and enters into cavity 24. Although displaceable member 26 of a presently preferred embodiment can withstand approximately 100 psi of fluid pressure when displaceable member 26 is made of silicon, it can still be desirable to compensate for the fluid pressure exerted on stopper end portion 42 of displaceable member 26. Complete compensation in unnecessary, though, as the inherent strength of the material, such as silicon, can easily withstand a relatively small imbalance of pressure. By providing the opposing second inlet port 52, microvalve 10 can withstand fluid pressures up to thousands of psi.

Figure 8:
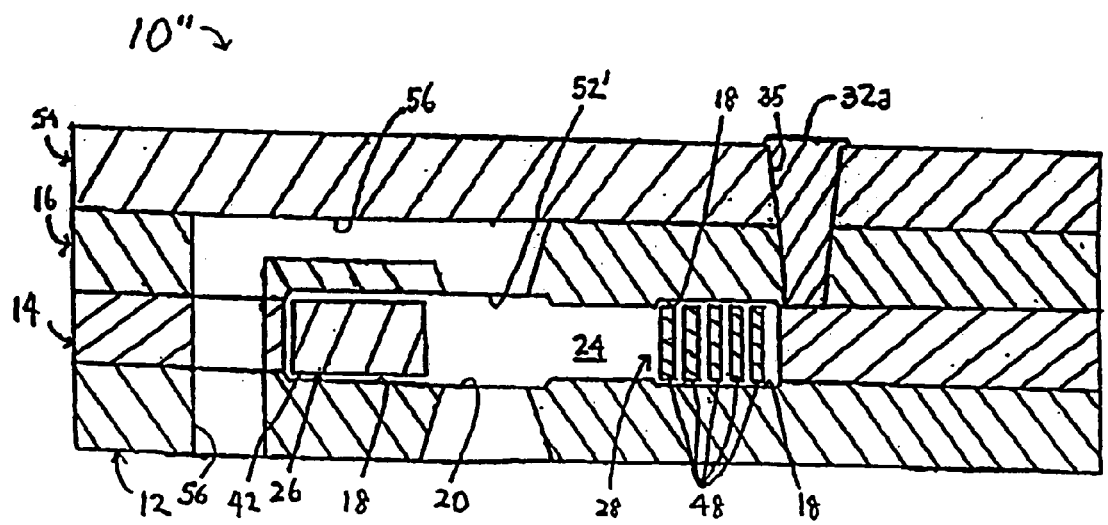
FIG. 8 shows a cross sectional view of another microvalve having a second inlet port with fluid entering from the same side of the microvalve to provide pressure balancing.

FIG. 8 illustrates a cross-sectional view of another alternative embodiment which includes an inlet channel 56 and a second inlet port 52' to compensate or balance the vertical fluid impingement forces on the displaceable member 26. Inlet channel 56 extends through first, second and third layers 12, 14, 16 and directs the flow into cavity 24 through second inlet port 52. Thus, fluid may be introduced through first layer 12 of microvalve 10" and directed to be introduced into cavity 24 from opposite directions. Fourth layer 54 is provided to cap inlet passageway 56 over third layer 16 and is disposed such that third layer is between second and fourth layers 14, 54.

Referring now to the partial top plan views of FIGS. 9-13, in addition to the fluid pressure due to fluid impingement forces, stopper end portion 42 of the displaceable member 26 is also subjected to a localized fluid force on inlet fluid flow face 58 as well as flow perturbations. The localized force on face 58 is caused by a bend in the flow path as fluid enters cavity 24 through inlet port 20 and/or second inlet port 52. This force urges displaceable member 26 to be displaced in the direction determined by the orientation of the fluid force. Thus, it is also desirable to compensate for the flow perturbations in the same plane as the displaceable member motion.

FIGS. 9-13 illustrate various methods and configurations to achieve the compensation of fluid forces. Each of the embodiments shown in FIG. 9-13 includes a fluid force coupling surface that is impinged by fluid flowing from the inlet port 20 to the outlet port 22 to subject the displaceable member 26 to a coupling: force that is exerted by the fluid. The coupling force is caused either by the impingement of the fluid flow on a surface different from the face 58 (embodiments shown in FIGS. 9 and 10) or by redirecting or at least perturbing the fluid flow back toward the face 58 (embodiments shown in FIGS. 11-13).

Figure 9A:
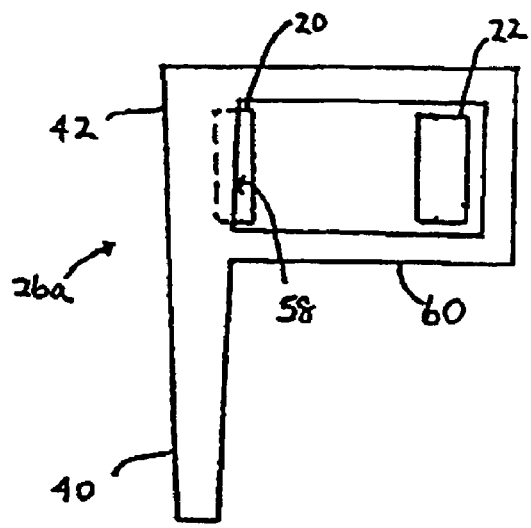
FIGS. 9A, 9B, 9C and 10 show partial top plan views illustrating displaceable members including extensions to provide fluid force compensation.

As shown in FIG. 9A, displaceable member 26a may further comprise a generally U-shaped extension 60 to form a P-shaped displaceable member 26a wherein the U-shaped extension 60 at least partially encircles or encloses outlet port 22. Fluid flow would exert a force on U-shaped extension 60 to at least partially compensate and balance the localized force at face 58 of stopper end portion 42. U-shaped extension 60 additionally encloses fluid flow between stopper end portion 42 of displaceable member and extension 60 and thus may also reduce the fluid leakage of the microvalve. The end use further allows the pressure exterior to the enclosure to be relatively constant resulting in little or no net pressure from areas exterior to the enclosure. Other suitable shapes of extension 60 may be utilized, such as L-shaped to form an h-shaped displaceable member (not shown).

Figure 9B:
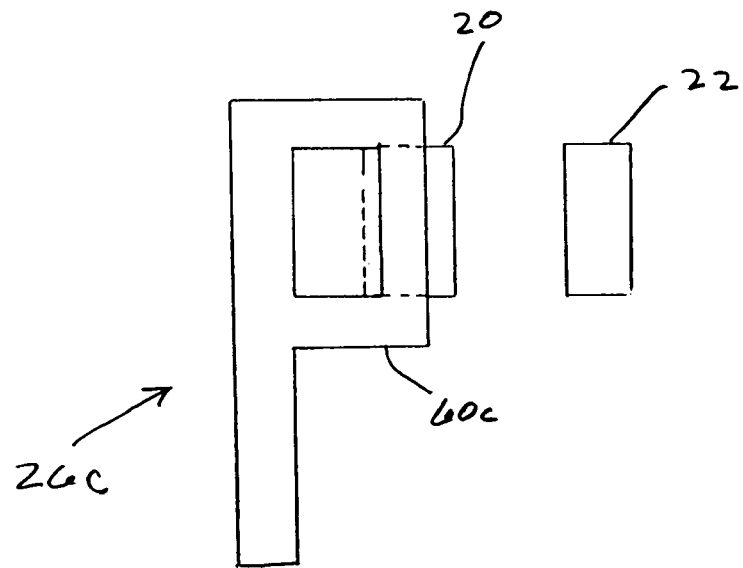

Alternatively, as shown in FIG. 9B, displaceable member 26c could include a smaller generally U-shaped extension 60c to form a P-shaped displaceable member 26c. Extension 60c is sized such that inlet port 20 will be open to the interior U-shaped extension. 60c when the microvalve is in a closed position. In the embodiment shown in FIG. 9B, fluid preferably flows both from the top and the bottom of displaceable member 60c. This achieves pressure balancing in two directions: at the top and bottom faces; and at the left and right faces.

Figure 9C:
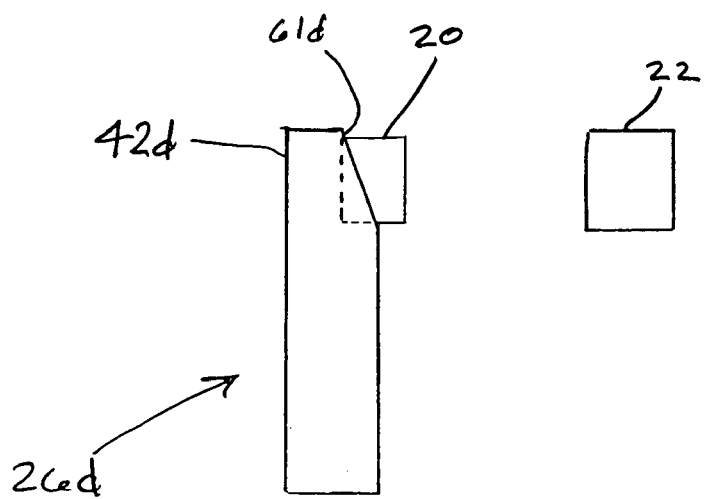

FIG. 9c shows yet another embodiment of a displaceable member 26d having a taper 61d at stopper end portion 42d. In this way, the width of displaceable member 26d is smaller at stopper end portion 42d thereof than at the opposite end. The end of stopper end portion 42d of displaceable member 26d may move a greater distance upon actuation of displaceable member 26d than any other portion thereof. By providing taper 61d, inlet port 20 will be closed and opened more uniformly from top to bottom upon actuation of displaceable member 26d.

Figure 10:
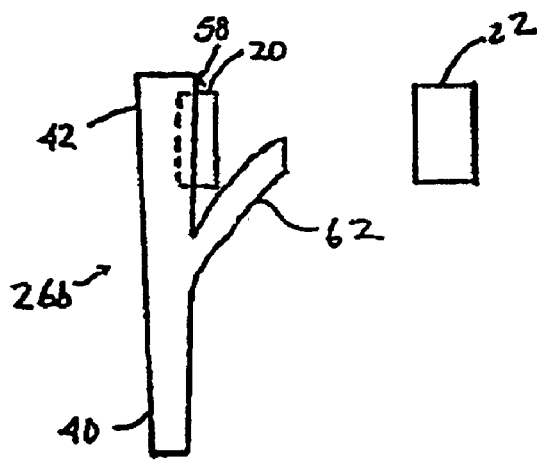

Alternatively, as shown in FIG. 10, displaceable member 26b may comprise extension 62 disposed between inlet 20 and outlet 22 rather than encircle outlet 22. Extension 62 redirects fluid flow such that fluid flow exerts a force on extension 62 to at least partially compensate and balance the localized decrease force at face 58 of stopper end portion 42.

Figure 11:
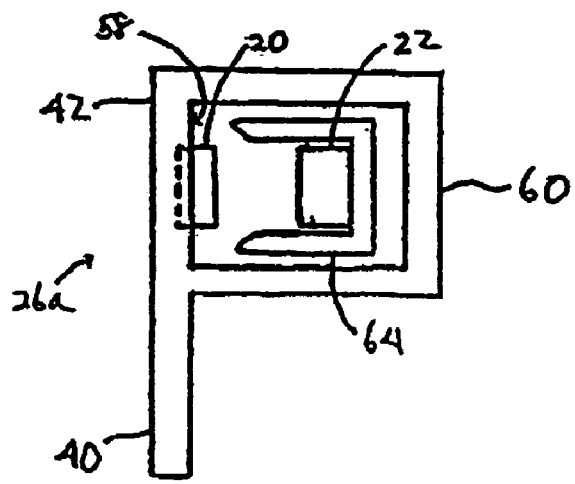
FIGS. 11-13 show partial top plan views illustrating the microvalve of the present invention further including one or more baffles and extensions for redirecting fluid flow.
Figure 12:
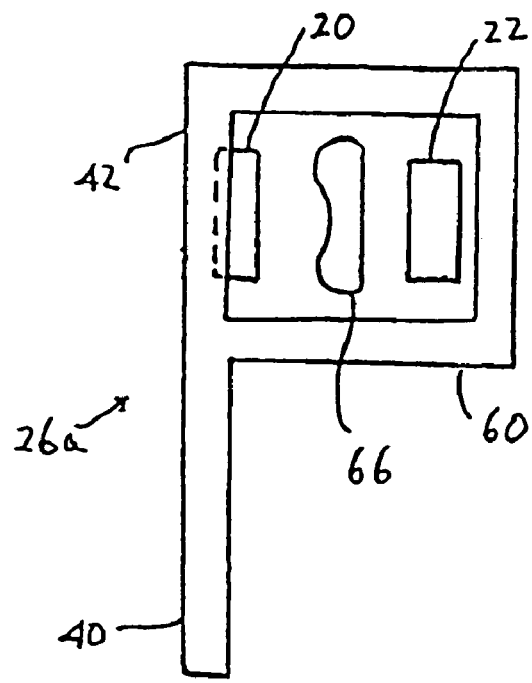
Figure 13:
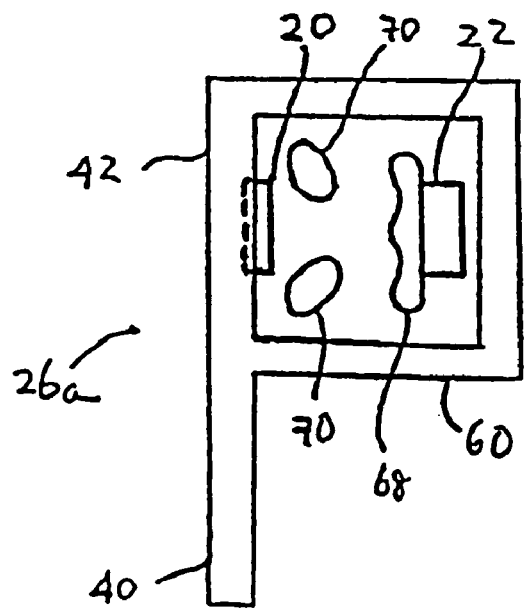

As shown in FIGS. 11-13, one or more members fixed to first layer 12 and/or third layer 16 may alternatively or additionally be provided in cavity 24 to redirect fluid flow to compensate or balance the localized force on face 58 of stopper end portion 42. As shown in FIG. 11, member 64 may be provided within cavity 24 and displaceable member 26a may comprise extension 60 to enclose the fluid flow therein. The combination of extension 60 and member 64 may result in force compensation without redirecting the fluid flow at displaceable member 26a. Alternatively, baffle 66 may comprise a curved surface, as shown in FIG. 12; to redirect flow toward face 58, thereby compensating for the force. FIG. 13 shows a microvalve having curves baffle 68 and baffles 70 which also redirect flow around baffles 70 to compensate and balance the fluid forces.

Figure 14:
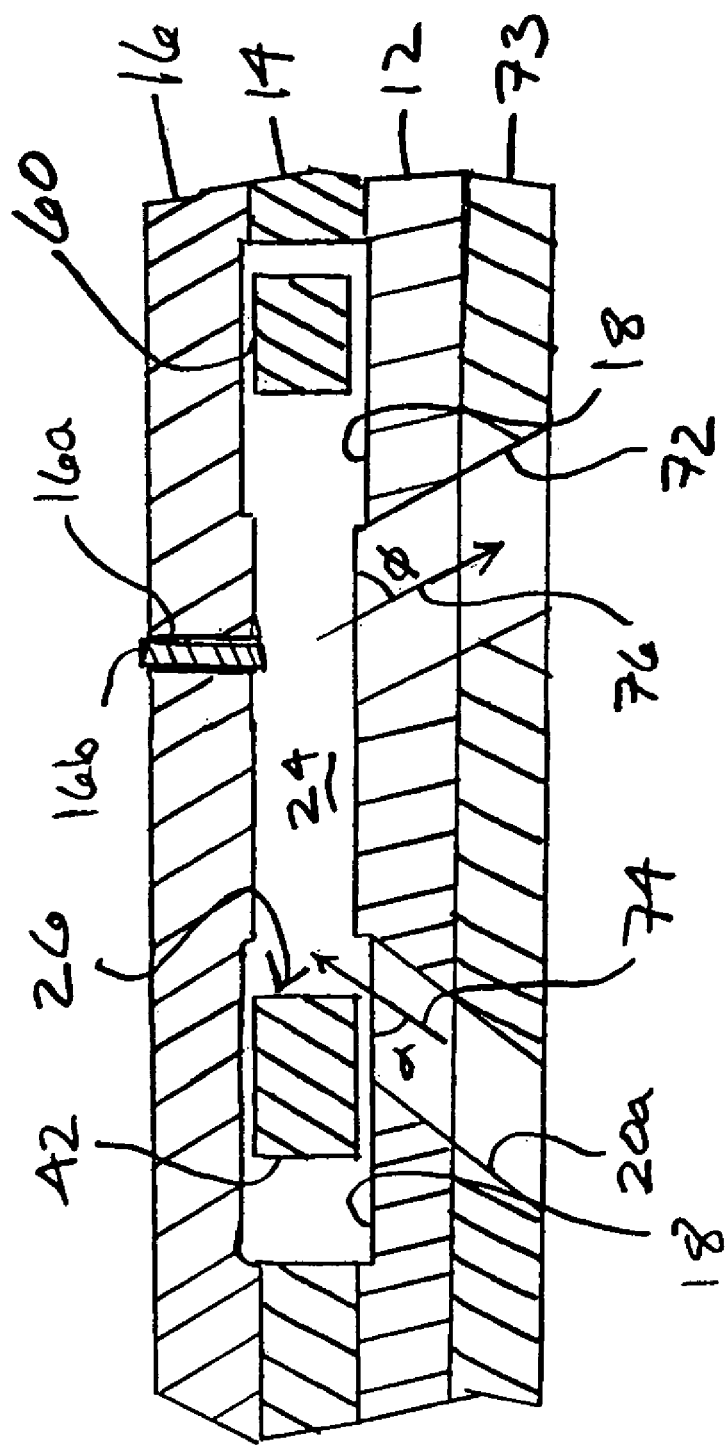
FIG. 14 shows a partial cross-sectional view of a microvalve having an angled inlet and outlet port.

FIG. 14 is an illustrative drawing of yet another alternative embodiment of the invention in which an angled outlet 72 and an angled inlet 20a serve as fluid force flow compensation members. Although angled outlet 72 and angled inlet 20a are shown in FIG. 14 as being partly defined by another layer 73, they may be defined only by first layer 12. Fluid flows into cavity 24 through angled inlet 20a in a direction indicated by arrow 74 at inlet angle $\alpha$ and fluid exits from cavity 24 in a direction indicated by arrow 76 at exit angle $\phi$. Inlet angle $\alpha$ is controlled by displacement of stopper end portion 42 of displaceable member 26 while exit angle $\phi$ is generally a constant. Fluid inlet and exit angles $\alpha$, $\phi$, are selected to balance flow forces. Thus, fluid exit flow at exit angle $\phi$ exerts forces which balance against the forces exerted by fluid inlet flow at inlet angle $\alpha$. Additionally, as shown in FIG. 14, an opening 16a may be formed through layer 16 and a pressure sensor 16b placed in a fluid-tight manner in opening 16a. This allows a measurement to be made of the pressure difference between the inlet 20a and outlet 72. Such pressure sensors 16b are well known in the art.

Figure 15:
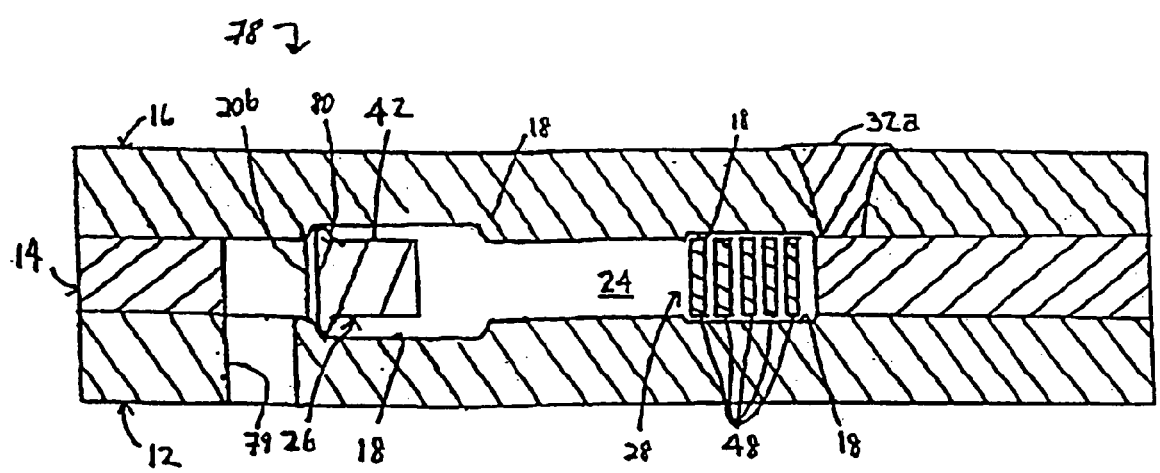
FIG. 15 shows a cross-sectional view of a proportional gas microvalve of the present invention.

Referring now to FIG. 15, there is shown a cross-sectional view of yet another alternative embodiment of a microvalve 78 in accordance with the invention. Microvalve 78 may be utilized as a gas valve. For gas microvalve 78, the gap between recess 18 and stopper end portion 42 when displaceable member 26 is in a closed position is preferably less than the 0.5 μm gap for the fluidic microvalve 10. Minimizing the gap prevents or minimizes gas leakage as leakage is not reduced by high viscosity as is the case for a liquid valve. The size of the gap may be reduced by reducing the depth of recesses 18 in first layer 12 and/or third layer 16.

Additionally or alternatively, the size the of gap may be further reduced by providing flanges 80 at an inlet face of stopper end portion 42 of displaceable member 26. Flanges 80 enhance the seal between inlet face of stopper end portion 42 and inlet 20b when displaceable member 26 is in a closed position. Preferably, an inlet channel 79 is provided through first and second layers 12, 14 to direct gas flow through inlet port 20b into cavity 24 such that gas enters cavity 24 in a direction parallel to the plane of the second layer 14. The inlet port 20b is preferably defined along a sidewall of the cavity 24 that is generally perpendicular to the plane of the second layer 14. Thus, displacement of displaceable member 26 in the plane of second layer 14 to close inlet 20b also causes flanges 80 to form a better seal against inlet 20.

Fabrication of a microvalve of a present embodiment of the invention involves fusion bonding, such as silicon fusion bonding, and deep reactive ion etching (DRIE). Fusion bonding allows the bonding of one silicon layer to another to form one single mechanical structure. The fusion bond has been demonstrated to be at the molecular level and provides very high mechanical robustness. Fusion bonding techniques are well known. See, for example, K. E. Petersen, D. Gee, F. Pourahmadi, R. Craddock, J. Brown and L. Christel, "Surface Micromachined Structures Fabricated with Silicon Fusion Bonding," *Proceedings, Transducers* 91, June 1992, pp. 397-399, which is expressly incorporated herein by reference.

The process for fabricating a silicon microstructure in accordance with a presently preferred embodiment of the invention is explained with reference to FIGS. 16a-f. The current embodiment employs three silicon wafers. Using three silicon wafers, the process results in the formation of a prescribed single-crystal silicon structure (SCS) microstructure as an integral portion of the second wafer, corresponding to second layer 14. First and third wafers, corresponding to the first and second layers 12, 16, serve as carriers for the second wafer. Alternatively, the carriers can be formed of glass (Pyrex), for example. It will be understood, of course, that although the following discussion only refers to three wafers, the principles can be applied to the formation of a microstructure comprising a stack of two or more wafers.

Figure 16:
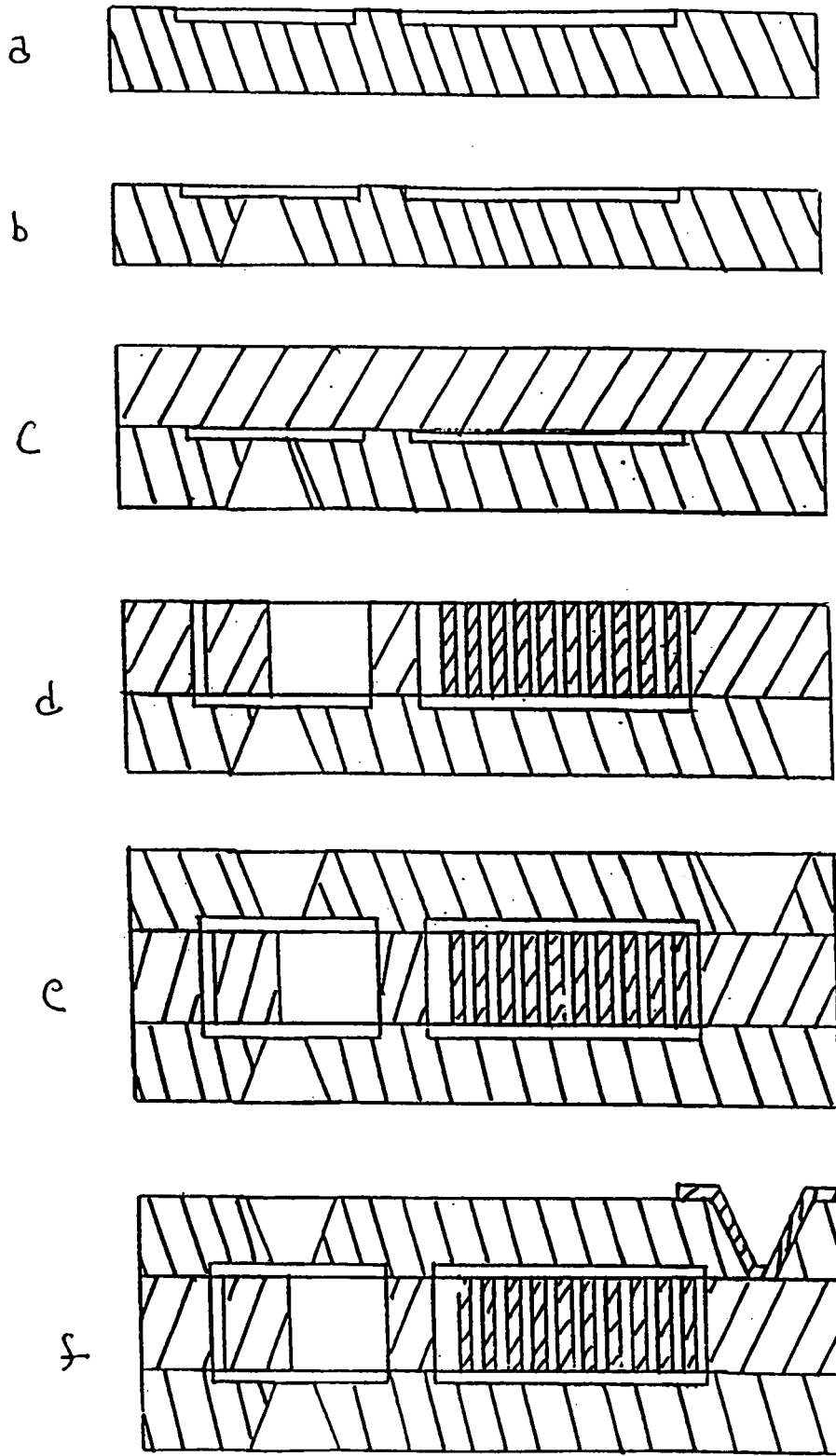
FIGS. 16a-f illustrate the fabrication process flow in accordance with the invention.

In FIG. 16a, the first wafer is patterned with a photoresist to define recessed region(s) to be formed therein and the recessed region(s) are formed using standard semiconductor techniques such as, for example, plasma etching, wet-etching with KOH or other silicon etchants, or differential oxide growth. The recessed region(s) can have any arbitrary geometry and can have any required depth, from less than 0.1 µm to more than 100 µm, for example. In the current embodiment, the recessed regions has a depth of approximately 1 µm.

It should be appreciated that the recessed region need not have a single, uniform depth. For example, several standard silicon etch steps may be employed to produce several different depths that can be used for different mechanical functions. It should also be appreciated that, alternatively or additionally, second layer may be indented (not shown) from first and third layers 12, 16 to provide clearance therebetween, as described above. Moreover, each of the first and third wafer surfaces can be either bare silicon or it can be coated with an oxide layer. Also, the base of the recessed region can be either bare silicon, oxidized silicon, doped silicon, or it can be coated with any other thin film capable of withstanding subsequent wafer bonding and processing temperatures.

As shown in FIG. 16b, an inlet port is then etched through the first wafer. Although not shown, the outlet port may be simultaneously etched through the first wafer. Alternatively or additionally, the outlet port may be etched through the third wafer.

In FIG. 16c, the patterned surface of the first wafer is bonded to a second wafer, preferably doped, by silicon fusion bonding (or direct bonding) process. As noted above, fusion bonding techniques are well known. In a currently preferred fusion bonding technique, the first and second wafers are made hydrophilic. That is, they are treated with an agent such as hot ammonium hydroxide or a hot sulfuric acid and hydrogen peroxide solution or another strong oxidant, that hydrates the surfaces. After drying, the two wafers then are placed in an oxidizing atmosphere at a temperature of 400° C.-1200° C. for approximately one hour.

The silicon fusion bonding technique described above bonds the first and second wafers together without the use of an intermediate adhesive material that could have a different coefficient of thermal expansion than the single-crystal silicon wafers. Furthermore, fusion bonding can be performed in which oxide or nitride layers have been formed in the bonded surfaces of one or both of the wafers.

As an alternative to fusion bonding, for example, the first and second wafers can be adhered together with an adhesive such as a photoresist. As another alternative, the first and second wafers can have their major surfaces coated with a metal layer, such as gold, used to alloy the wafers to one another. In the event that a glass (Pyrex 7740) carrier is used instead of the first silicon wafers, the second wafer can be anodically bonded to such glass carrier.

If necessary, the second wafer may be thinned and polished to the thickness required by the particular application. Alternatively, electrochemical etching (ECE) can be used to thin the wafer. Diffused heaters may be incorporated into a plane surface of second layer 14 by diffusion. In addition, any necessary circuits or other thin film depositions and patterning can be performed using standard silicon processing techniques.

The second wafer is then patterned for a Deep Reactive Ion Etching (DRIE) step which defines the regions of the wafer to be etched. DRIE techniques have become increasingly well known. For example, refer to: A. A. Ayon, C. C. Lin, R. A. Braff, and M. A. Schmidt, "Etching Characteristics and Profile Control in a Time-Multiplexed ICP Etcher", *Proceedings of Solid State Sensor and Actuator Workshop*, Hilton Head Island, S.C., June 1998, pp. 41-44; V. A. Yunkin, D. Fischer, and E. Voges, "Highly Anisotropic Selective Reactive Ion Etching of Deep Trenches in Silicon," *Microelectronic Engineering*, Vol. 23, 1994, at 373-376; C. Linder, T. Tschan, N. F. de Rooij, "Deep Dry Etching Techniques as a New IC Compatible Tool for Silicon Micromachining," *Proceedings, Transducers '91*, Jun. 1991, at 524-527; C. D. Fung and J. R. Linkowski, "Deep Etching of Silicon Using Plasma," *Proceedings of the Workshop on Micromachining and Micropackaging of Transducers*, Nov. 7-8, 1984, at 159-164; and J. W. Bartha, J. Greeschner, M. Puech, and P. Maquin, "Low Temperature Etching of Si in High Density Plasma Using $SF_6/O_2$,". *Microelectronic Engineering*, Vol. 27, 1995, at 453-456. Each of these references expressly incorporated herein by reference. Reactive Ion etch equipment now allows the etching of holes or trenches which are very deep (>100 microns), while maintaining high aspect ratios (the ratio between the depth of the etched region and the width of the etched region). It has been found that this equipment is capable of at least 30:1 aspect ratios for trenches as deep as 300 microns.

DRIE, in essence, involves a synergistic action between chemical etch and ion bombardment. The DRIE process advantageously etches in the vertical direction at a much higher rate than in the lateral direction (i.e., anisotropically) regardless of silicon crystal planes or crystal orientation. As a result, relatively deep substantially vertical trenches or slots can be formed in the single-crystal silicon (SCS) second wafer. These substantially vertical trenches or slots can be formed anywhere in the second wafer regardless of crystallographic orientation within the wafer. Consequently, high aspect ratio structures such as capacitive or electrostatic plates can be formed, and arbitrarily contoured structures such as circles, ellipses and spirals can be formed.

As shown in FIG. 16d, a DRIE process is used to etch completely through the second wafer to define the displaceable member and the actuator(s). The DRIE etching step mechanically releases the single-crystal silicon (SCS) microstructures formed in the second wafer, which are then free to move relative to and in the plane of the second wafer. Suspended plate/beam structures with aspect ratios (height/width) of 20:1 or greater have been fabricated using the DRIE processes described below.

An inductively coupled plasma source etches the silicon using photoresist or silicon dioxide as a mask. Polymerization of a source gas on the sidewalls of the etched trenches slows the lateral etch rate and allows high anisotropy. The etching chemical is $SF_6$ at, for example, 15 millitorr. A six-micron thick photoresist layer serves as the patterning mask. The photoresist selectivity is approximately 50:1, which makes it possible to etch to depths of 300 µm with about 6 µm of resist. The "multiplex RIE system", available from Surface Technology Systems (STS) which has a place of business in Redwood City, Calif. can be employed to perform inductively coupled plasma DRIE, or from Unaxis in St. Petersburg, Fla.

The combination of fusion bonding and DRIE allows the construction of three-dimensional structures, such as the microvalve of the present invention. See, for example, E. H. Klaassen, K. Petersen, J. M. Noworolski, J. Logan, N. I. Maluf, J. Brown, C. Storment, W. McCulley and G.T.A. Kovacs, "Silicon Fusion Bonding and Deep Reactive Ion Etching; A New Technology for Microstructures", *Proceedings, Transducers* 95, Stockholm, Sweden, 1995, at pp. 556-559.

In FIG. 16*e*, the patterned surface of the third wafer is bonded to the second wafer by silicon fusion bonding (or direct bonding) process, as described above with reference to FIG. 16*c*. Although not shown, it is to be understood that prior to the bonding, the third wafer was processed similar to the first wafer to define recessed region(s), inlet port and/or outlet port, as well as through-wafer contact hole(s) or via(s).

As shown in FIG. 16*f*, a layer of electrically conductive material such as aluminum is deposited, such as by sputtering, onto the surfaces of the contact hole(s) or via(s), the surface of the second wafer exposed through the contact hole, and at least a portion of the exterior planar surface of the third wafer. The conductive layer thus forms bond pad(s) to enable electrical contact to the actuator(s). Any necessary circuits or other thin film depositions and patterning can be performed using standard silicon processing techniques on the third wafer.

Any of a number of variations may be easily incorporated into this process. For example, first and/or third layers 12, 16 can be made of glass (Pyrex) instead of silicon. The microvalve may be formed from more than three wafers or layers or a micromechanical device may be formed from two or more wafer or layers. Furthermore, shallow cavities can be defined in the second layer 14 instead of in or in addition to the first and third layers 12, 16. Alternatively, each of the layers may be separately processed and then assembled by an aligned bonding step. As is evident, one of ordinary skill in the art can easily make these and numerous other variations to the fabrication process by, for example, merely modifying the layout.

The microvalve of the present invention may be adapted for use in anti-lock brake systems, as described below, ink jet printing, refrigeration, pilots for larger valves, e.g., for automatic transmissions and large industrial valves.

Figure 17:
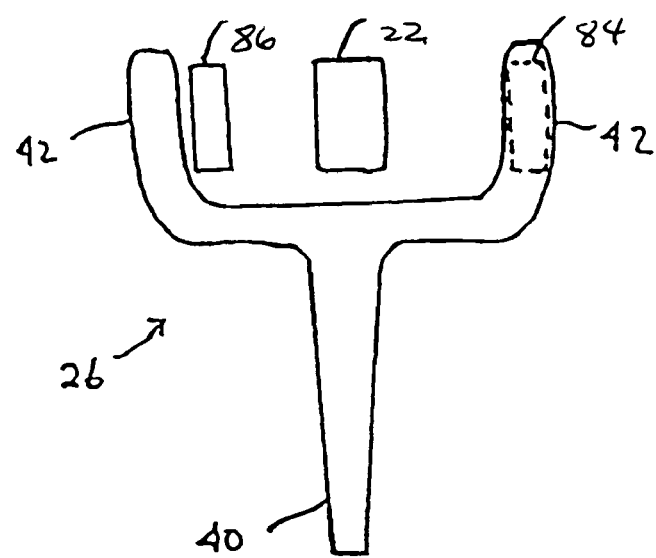
FIG. 17 shows a top plan view of a displaceable member for closing and opening two inlet ports for control of fluid flow to outlet port.

Referring now to FIG. 17, microvalve 82 may also be adapted to selectively control two inlet ports 84, 86 for fluid flow into one outlet 22. The opening and closing of inlet ports 84, 86 are interdependent. Other details of microvalve 82 will be understood from the above description with reference to other FIGS. Specifically, upon actuation, microvalve 82 may be controlled to open inlet port 84 while keeping inlet port 86 closed, or vice versa. Microvalve 82 may also be controlled to partially open both inlet ports 84, 86. Thus, microvalve 82 may be utilized to select fluid flow from one or two fluid sources.

Figure 19:
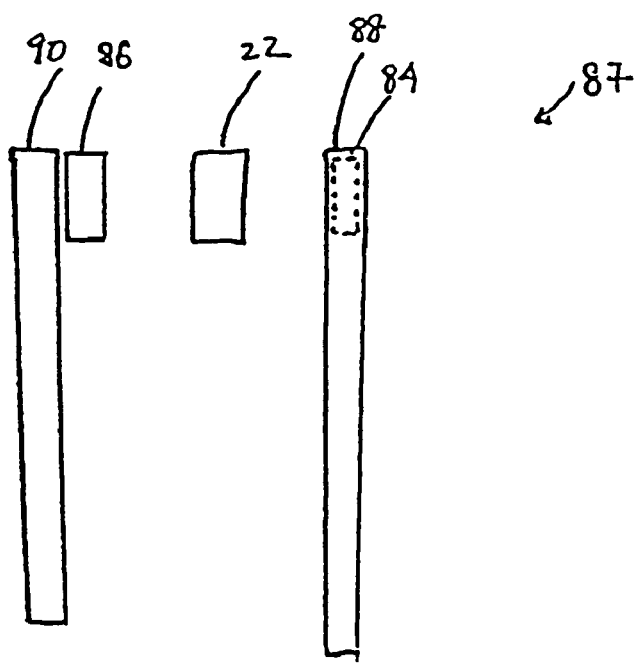
FIG. 19 shows a top plan view of a microvalve having two displaceable members for independently closing and opening two inlet ports for control of fluid flow to outlet port.
Figure 18:
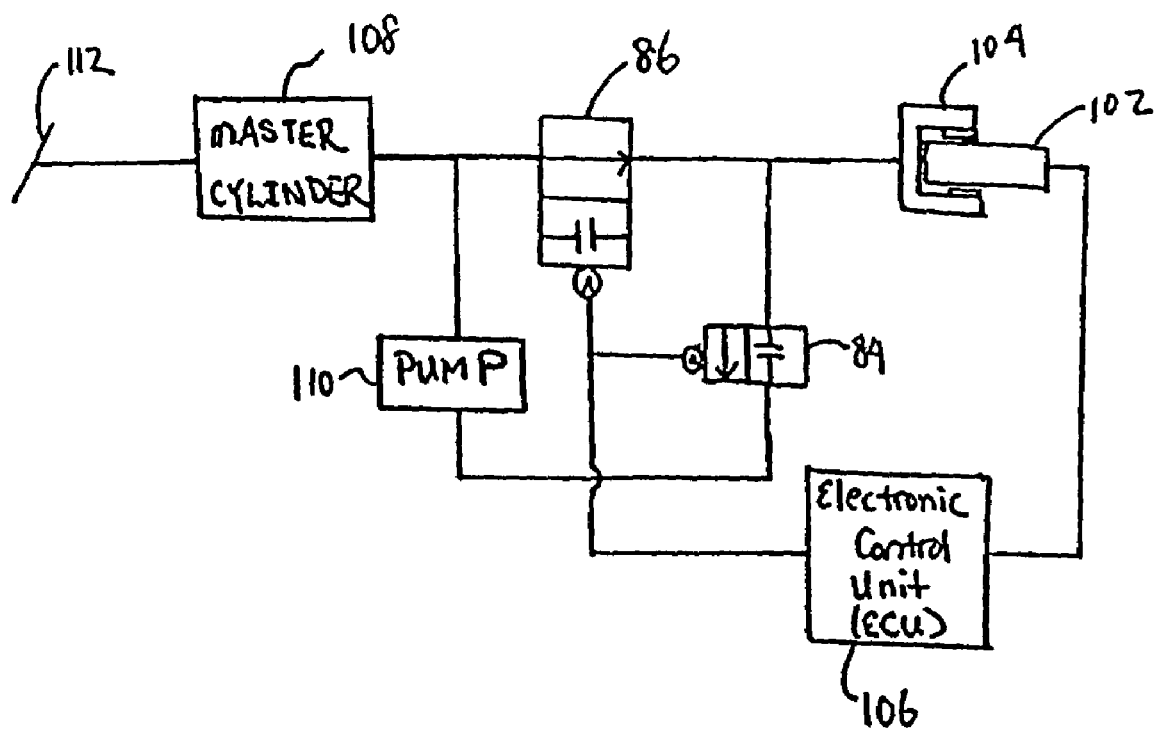
FIG. 18 shows a schematic of a portion of an anti-lock brake system illustrating the utilization of valves.

As is evident, numerous other fluid flow control integration may be achieved with the microvalve of the present invention. For example, a single integrated microvalve 87 of the present invention may be utilized to replace a normally open (N.O.) and a normally closed (N.C.) solenoid valve utilized for each wheel of a conventional anti-lock brake system. A schematic of a portion of an anti-lock brake system 100 which utilizes the single integrated microvalve and a partial schematic of such a single integrated microvalve 87 are shown in FIGS. 18 and 19, respectively.

Anti-lock brake systems (ABS) have become very common in passenger vehicles. As shown in FIG. 18, anti-lock brake system 100 generally comprises a wheel speed sensor (not shown) for sensing the speed of wheel 102, a normally open (N.O.) valve 86 and a normally closed (N.C.) valve 84 for controlling the flow of brake fluid to and from the brake caliper 104 of wheel 102, an electronic control unit (ECU) 106 which receives input from the wheel speed sensor and outputs signals to microvalve 87, a master cylinder 108 and a pump 110. As shown in FIG. 19, microvalve 87 defines one outlet port 22 for directing brake fluid to the brake caliper and two displaceable members 88, 90 to selectively open and close two inlet valves 84, 86, respectively.

Normally open inlet 86 allows brake fluid to flow from master cylinder 108 to brake caliper 104 when the driver applies pressure to brake pedal 112. Without actuation of the ABS system, normally closed valve 84 is at least substantially closed to flow of brake fluid and normally open valve 86 allows for the flow of brake fluid to brake caliper 104 upon application of pressure on the brake pedal 112 by the driver.

However, a slippery road surface may result in insufficient frictional or gripping force between the tire and the road such that, as the driver applies pressure to brake pedal 112, brake caliper 104 locks wheel 102. When the brake caliper 104 locks wheel 102 and stops wheel 102 from rotating; wheel 102 skids along the slippery road so that the vehicle braking distance is increased. Thus, the vehicle continues to move due to the momentum of the vehicle. Essentially, locking of the wheels by the brake system occurs when the gripping force between the tire and the road is less than the braking or gripping force between the wheel and the brake pads.

The anti-lock brake system alleviates or solves the wheel locking problem by regulating the brake-fluid pressure applied until the suitable level of brake force is reached, i.e. by decreasing the braking force to a level equal to the gripping force between the wheel and the road. The anti-lock brake system is activated in response to the wheel speed sensor detecting that the wheels are tending toward locking. Upon activation of the anti-lock brake system, the electronic control unit (ECU) 106 closes the N.O. valve. If the wheel speed sensor continues to sense the wheel tending toward locking even after the N.O. valve is closed, the ECU opens the N.C. valve and pumps some brake fluid from the wheel cylinder or caliper into the master cylinder. The N.C. valve is repeatedly pulsed open and closed to regulate flow of the brake fluid until the computer determines that the braking is in control, i.e. when the wheel speed sensor detects that the wheels are no longer tending toward locking. By repeatedly pulsing the N.C. valve open and closed, proportionality of fluid flow control is achieved. The anti-lock brake system is only activated while the brake pedal is depressed.

A conventional anti-lock brake system of an automobile or passenger car utilizes two solenoid valves per wheel to control the flow of the brake fluid, resulting in the use of eight solenoid valves for a typical four-wheel passenger vehicle. However, the use of solenoid valves has several disadvantages, as discussed above. Although proportional solenoid valves are available, cost-effective solenoid valves used for anti-lock brake systems perform solely on and off (binary) switching, thus requiring that the valves be pulsed to obtain the precise desired level of flow control. Such pulsing, being load, can be sensed by the driver while depressing the brake pedal which may be undesirable.

Microvalve 87 as shown in FIG. 19 can be utilized to replace the two solenoid valves of the conventional anti-lock brake system. Each of displaceable members 88, 90 is separately controlled by their respective thermal actuators. However, in the anti-lock brake system, displaceable members 88, 90 would not both be in the open position simultaneously. Thus, during a normal braking operation, displaceable member 90 (in the normally open position relative to inlet 86) would be in the open position while displaceable member 88 (in the normally closed position relative to inlet 84) would be in the closed position. Thus, when the driver depresses brake pedal 112 during a normal braking operation, pump 110 pumps brake fluid from master cylinder 108 to brake caliper 104 through normally open inlet 86.

When the ECU 106 senses that wheel 102 has exceeded predetermined thresholds, the ECU 106 sends a signal to microvalve 87 to displace displaceable member 90 to the closed position relative to inlet 86 and to displace displaceable member 88 from its closed position to a position between the open and closed positions relative to inlet 84. Displacing displaceable member 88 to a position between the open and closed positions relative to inlet 84 allows a desired level of brake fluid to be removed by the pump 110 from brake caliper 104 into master cylinder 108. Thus, only one integrated microvalve is utilized to replace the two conventional binary solenoid valves.

Displaceable member 88 would preferably not be pulsed between the open and closed positions and is preferably displaced to a location between the open and the closed position to precisely control the desired amount of brake fluid to be pumped from the brake caliper 104. However, it is to be appreciated that displaceable member 88 may be pulsed between the open and closed position relative to inlet 84 in order to achieve the proportional fluid flow control.

While specific embodiments of the invention have been described and illustrated, it will be appreciated that modifications can be made to these embodiments without departing from the spirit of the invention. Thus, the invention is intended to be defined in terms of the following claims.

The invention claimed is:

1. A microvalve comprising:
   a first layer, a second layer defining a flow area, and a third layer, the second layer disposed between the first layer and the third layer and having a stationary portion fixed to at least one of the first layer and the third layer,
   the first layer defines a first port there through and at least one of the first layer and the third layer defines a second port there through to permit fluid flow from the first port to the second port through the flow area defined in the second layer,
   a first member defined by the second layer;
   a displaceable structure attached to the first member and including a first end fixed to the stationary portion of the second layer, the displaceable structure further including a second end; and
   a first thermal actuator defined by the second layer and operatively coupled to the displaceable structure to displace the second end of the displaceable structure in a plane parallel to the second layer between an open state and a closed state relative to one of the first and second ports.

2. The microvalve of claim 1 further including:
   a second member defined by the second layer and attached to the displaceable structure; and
   a second actuator defined by the second layer and operatively coupled to the displaceable structure through the second member.

3. The microvalve of claim 2 wherein the first actuator is operatively coupled to the displaceable structure through the first member.

4. The microvalve of claim 3 further including first electrical contacts formed through the third layer and coupled to the first actuator to provide a first electrical control signal thereto and second electrical contacts formed through the third layer and coupled to the second actuator for providing a second electrical control signal to the second actuator.

5. The microvalve of claim 1 wherein the second end of the displaceable structure includes an extension which at least partially surrounds the second port, the extension further defining the flow area defined by the second layer.

6. The microvalve of claim 5 wherein the extension completely surrounds the second port.

7. The microvalve of claim 1 including a sensor operatively coupled to the displaceable structure and for sensing displacement thereof.

8. The microvalve of claim 1 wherein the second end of the displaceable structure includes an extension which surrounds only the first port, the extension further defining the flow area defined by the second layer.

9. The microvalve of claim 1 wherein a width of the displaceable structure increases from the first end to the second end thereof.

10. The microvalve of claim 1 wherein a width of the displaceable structure is smaller at a second end thereof that at a first end thereof.

11. The microvalve of claim 1 wherein a width of the displaceable structure decreases from the first end to the second end thereof.

12. The microvalve of claim 11, wherein the first actuator is disposed outside of the flow area.

13. The microvalve of claim 1, wherein the first actuator is formed by deep reactive ion etching.

14. The microvalve of claim 13, wherein the displaceable structure is formed by deep reactive ion etching.

15. The microvalve of claim 1 wherein the second layer includes highly doped single-crystal silicon.

16. The microvalve of claim 1 wherein the displaceable structure has a length and wherein the actuator is secured to the displaceable structure at a location along the length of the displaceable structure.

17. A microvalve comprising:
   a first layer, a second layer and a third layer, the second layer disposed between the first and third layers,
   the first layer defines a first port there through and at least one of the first and third layers defines a second port there through to permit fluid flow from the first port to the second port through a flow area defined in the second layer,
   a first member suspended within a cavity region defined by the second layer and including a proximal end and a distal end, the proximal end of the first member integrally secured to the second layer;
   a second member suspended within a cavity region defined by the second layer and including a proximal end and a distal end, the proximal end of the second member integrally secured to the second layer;
   a displaceable structure suspended within the cavity region and including a first end and a second end, the displaceable structure integrally secured to the distal end of the first suspended member and to the distal end of the second suspended member; and
   a first actuator unitarily formed in the second layer and operatively coupled to the first suspended member so as to displace the second end of the displaceable structure in a plane defined by the second layer and at a position between an open state and a closed state relative to one of the first and second ports; and first electrical contacts formed through the third layer and coupled to the first actuator to provide a first electrical control signal thereto.

18. The microvalve of claim 17 further including a second actuator defined by the second layer and operatively coupled to the displaceable structure through the second member.

19. The microvalve of claim 18 wherein the first actuator is operatively coupled to the displaceable structure through the first member.

20. The microvalve of claim 17 wherein the first and second members are secured on opposed sides of the displaceable structure.

21. The microvalve of claim 17 wherein the second end of the displaceable structure includes an extension which at least partially surrounds the second port, the extension further defining the flow area defined by the second layer.

22. The microvalve of claim 21 wherein the extension completely surrounds the second port.

23. The microvalve of claim 17 wherein the second end of the displaceable structure includes an extension which at least partially surrounds the first port.

24. The microvalve of claim 17 wherein a width of the displaceable structure increases from the first end to the second end thereof.

25. The microvalve of claim 24 wherein the width of the displaceable structure is greater at the first end thereof than the second end thereof.

26. The microvalve of claim 17 wherein the first actuator is formed by deep reactive ion etching.

27. The microvalve of claim 26 wherein the displaceable structure is formed by deep reactive ion etching.

28. The microvalve of claim 17 wherein the second layer includes highly doped single-crystal silicon.

29. A microvalve, comprising:
a first layer, a second layer defining a flow area, and a third layer, the second layer disposed between the first layer and the third layer,
the first layer defining a first port there through and second port there through to permit fluid flow from the first port to the second port through a flow area defined by the second layer,
the second layer defines a displaceable structure and at least one actuator disposed relative to a first end of the displaceable structure to move the displaceable structure in a plane parallel to the second layer, the displaceable structure movable to place a second end portion thereof at a position between an open and a closed position relative to one of the first and the second ports; and
an extension at the second end of the displaceable structure which surrounds the first port and at least partially surrounds the second port, the extension further defining the flow area defined by the second layer.

30. The microvalve of claim 29 wherein the extension completely surrounds the second port.

31. A microvalve comprising:
a first layer, a second layer, and a third layer, the second layer being disposed between the first and third layer;
the first layer defining a first port therethrough and at least one of the first layer and the third layer defining a second port therethrough to permit fluid flow from the first port to the second port through a flow area defined in the second layer;
a valve member disposed in the flow area of the second layer, the valve member having a portion thereof integrally secured to the second layer;
an actuator coupled to the valve member for moving the valve member in a plane parallel to the second layer between an open state and a closed state relative to one of the first and second ports; and
an electrical contact formed through the third layer and coupled to the actuator to provide an electrical control signal thereto.

32. The microvalve of claim 31, wherein the actuator is a thermal actuator.

33. The microvalve of claim 32, wherein the actuator is heated and expands when an electrical current is passed through the actuator.

34. The microvalve of claim 31, wherein the electrical contact is a first electrical contact and further including a second electrical contact formed through the third layer at al location spaced apart from the first electrical contact, the actuator being disposed between, and electrically coupled to, the first electrical contact and the second electrical such that an electrical current can be induced to flow between the first electrical contact and the second electrical contact through the actuator.

35. The microvalve of claim 34, wherein all electrical contacts are formed through the third layer, and all ports permitting fluid to flow into or out of the microvalve are formed through the first layer.

36. The microvalve of claim 34 wherein the second layer is formed of a conductive material, and the first electrical contact and the second electrical contact are in electrical contact with contact regions of the second layer that are electrically isolated from the rest of the second layer except for current conduction paths through the actuator.

37. The microvalve of claim 36 wherein a trench is defined in the second layer to electrically isolate the contact regions from adjacent portions of the second layer.

38. The microvalve of claim 37 wherein the actuator includes a first rib on one side of the trench and a second rib on the opposite side of the trench from the first rib, the ribs elongating in response to an increase in temperature of the ribs, the first contact being generally vertically aligned with the first rib and the second contact being generally vertically aligned with the second rib.

39. The microvalve of claim 31, wherein the first layer, the second layer, and the third layer are formed of materials having matched coefficients of thermal expansion such that ambient temperature does not substantially influence movement of the valve member.

40. The microvalve of claim 31 wherein the actuator is disposed in a chamber defined in the second layer in fluid communication with the flow area, but outside of the flow area between the first port and the second port, such that fluid in the chamber containing the actuator is generally stagnant in the region of the actuator.

* * * * *